（12） United States Patent
Onimaru et al.

(10) Patent No.: US 9,755,193 B2
(45) Date of Patent: Sep. 5, 2017

(54) BANK REPAIR METHOD, ORGANIC EL DISPLAY DEVICE, AND PRODUCTION METHOD FOR SAME

(71) Applicant: JOLED INC., Tokyo (JP)

(72) Inventors: Toshiaki Onimaru, Tokyo (JP); Takayuki Shimamura, Tokyo (JP); Kazuhiro Kobayashi, Kanagawa (JP); Yoshiki Hayashida, Osaka (JP); Tetsuro Kondoh, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/115,763

(22) PCT Filed: Feb. 6, 2015

(86) PCT No.: PCT/JP2015/000558
§ 371 (c)(1),
(2) Date: Aug. 1, 2016

(87) PCT Pub. No.: WO2015/118883
PCT Pub. Date: Aug. 13, 2015

(65) Prior Publication Data
US 2017/0012246 A1    Jan. 12, 2017

(30) Foreign Application Priority Data
Feb. 10, 2014 (JP) ................ 2014-023658

(51) Int. Cl.
*H01L 51/56* (2006.01)
*H01L 27/32* (2006.01)
*H01L 51/00* (2006.01)

(52) U.S. Cl.
CPC .......... *H01L 51/56* (2013.01); *H01L 27/3246* (2013.01); *H01L 51/0005* (2013.01); *H01L 2251/568* (2013.01)

(58) Field of Classification Search
CPC . H01L 27/3246; H01L 51/0005; H01L 51/56; H01L 2251/568
See application file for complete search history.

(56) References Cited

U.S. PATENT DOCUMENTS

2005/0140706 A1* 6/2005 Cheng ................. H01L 51/0005
                                                    347/8
2010/0015876 A1* 1/2010 Kang ..................... H01L 51/56
                                                    445/2
(Continued)

FOREIGN PATENT DOCUMENTS

JP        2007-090303        4/2007
JP        2007-264186        10/2007
(Continued)

OTHER PUBLICATIONS

U.S. Appl. No. 15/116,055 to Kazuhiro Kobayashi et al., which was filed Aug. 2, 2016.
(Continued)

*Primary Examiner* — Yasser A Abdelaziez
(74) *Attorney, Agent, or Firm* — Greenblum & Bernstein, P.L.C.

(57) ABSTRACT

An examination is performed of whether or not a bank having a defect portion is present. When a bank having a defect portion is present, the bank having the defect portion is repaired by forming a dam in each of adjacent concave spaces between which the bank having the defect portion is located. A dam formed in a concave space partitioning the concave space into a first space in a vicinity of the defect portion and a second space outside the vicinity of the defect portion.

17 Claims, 16 Drawing Sheets

(56) References Cited

U.S. PATENT DOCUMENTS

2011/0287682 A1* 11/2011 Miyazawa .......... H01L 27/3246
                                                    445/2
2014/0154818 A1*  6/2014 Shimamura ............ H01L 51/56
                                                    438/4

FOREIGN PATENT DOCUMENTS

| JP | 2008-076725  | 4/2008 |
| JP | 2009-104030  | 5/2009 |
| WO | 2010/013654  | 2/2010 |
| WO | 2010/092765  | 8/2010 |

OTHER PUBLICATIONS

U.S. Appl. No. 15/225,887 to Toshiaki Onimaru, which was filed Aug. 2, 2016.
U.S. Appl. No. 15/122,716 to Yoshiki Hayashida et al., which was filed Aug. 31, 2016.
International Search Report (ISR) from International Searching Authority (Japan Patent Office) in International Pat. Appl. No. PCT/JP2015/000558, dated Mar. 10, 2015.

* cited by examiner

FIG. 5A  Apply bank material
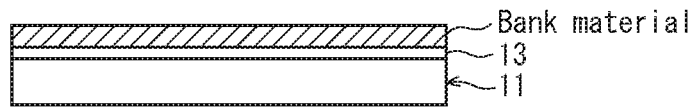
FIG. 5B  Expose to light
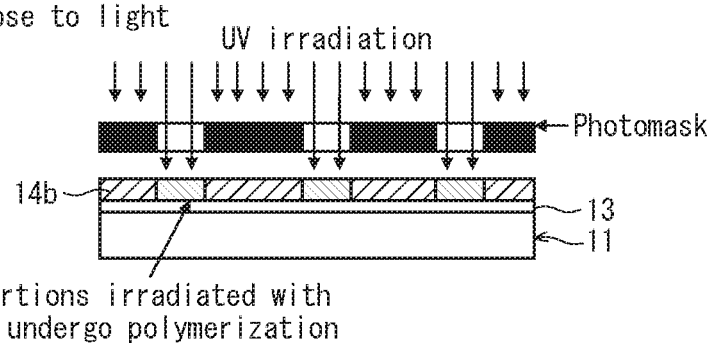
FIG. 5C  Develop
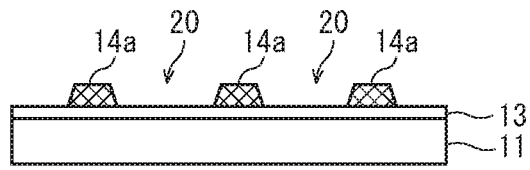
FIG. 5D  Repair bank
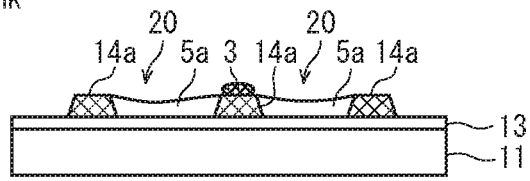
FIG. 5E  Fire simultaneously
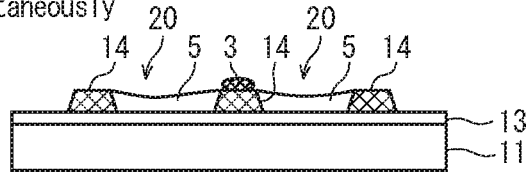
FIG. 5F  Apply ink
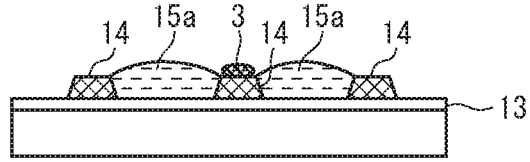
FIG. 5G  Dry
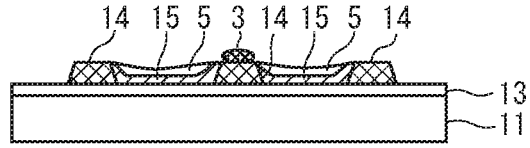

FIG. 10A
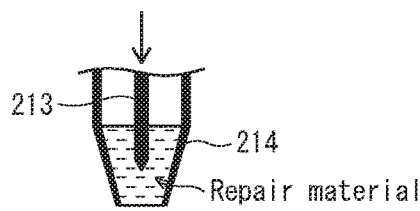
FIG. 10B
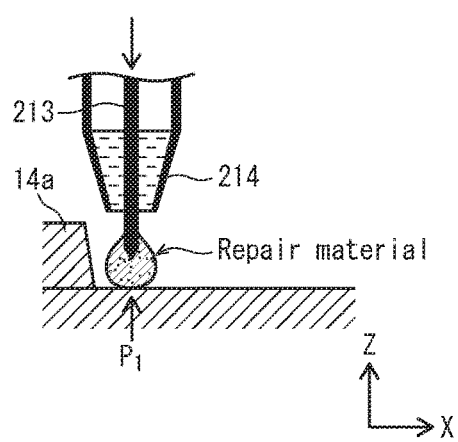
FIG. 10C
FIG. 10D
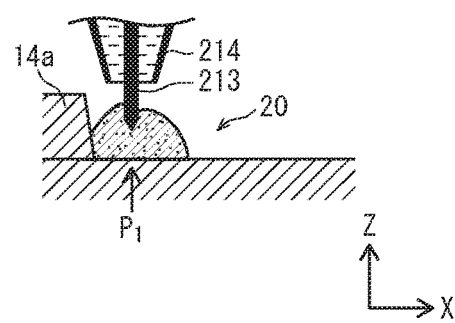
FIG. 10E
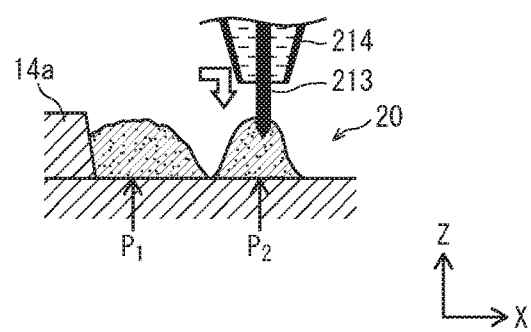
FIG. 10F
FIG. 10G
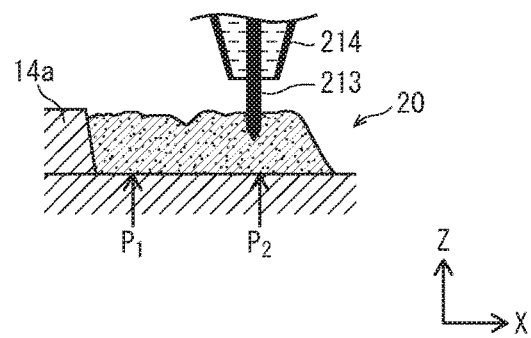
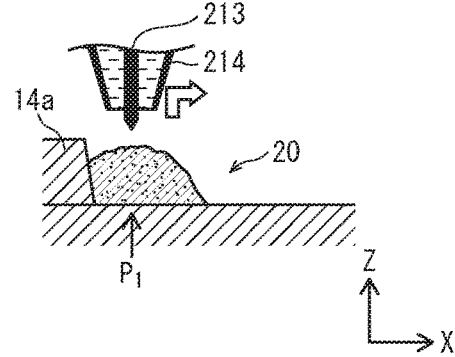
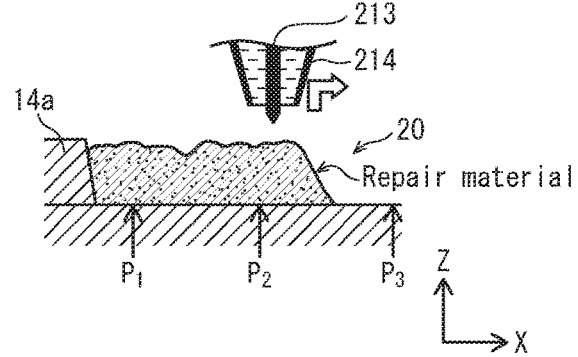

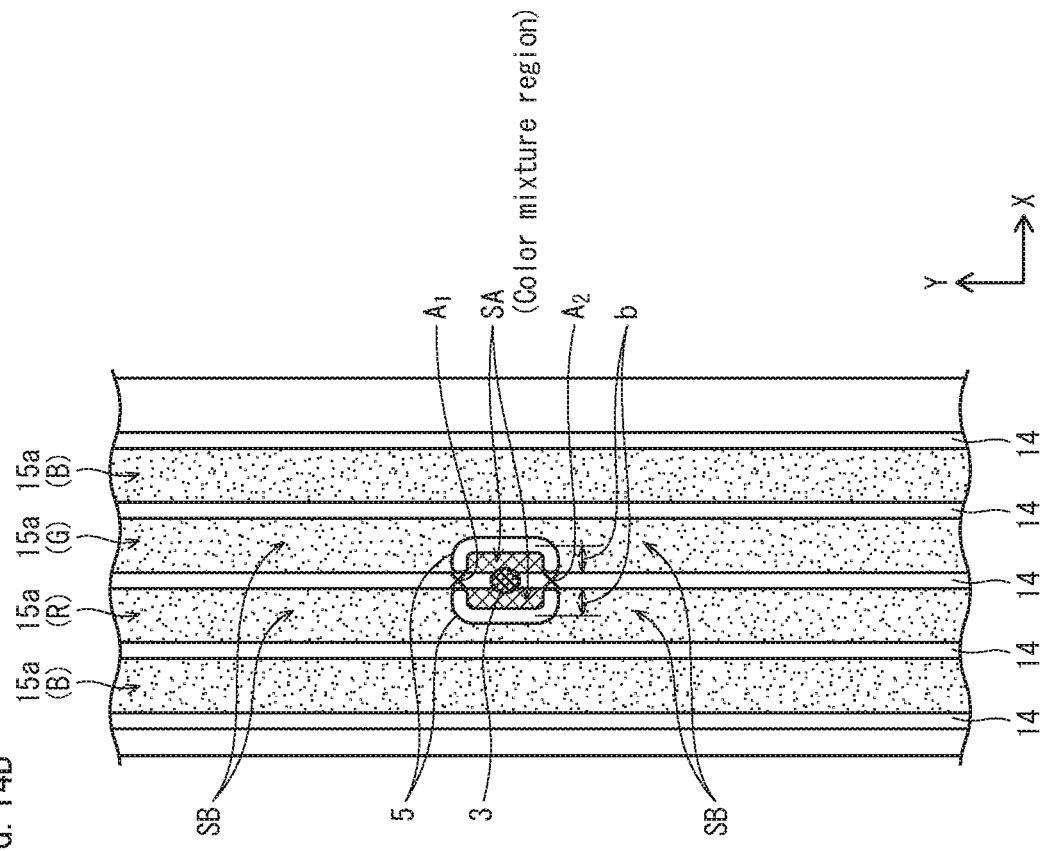
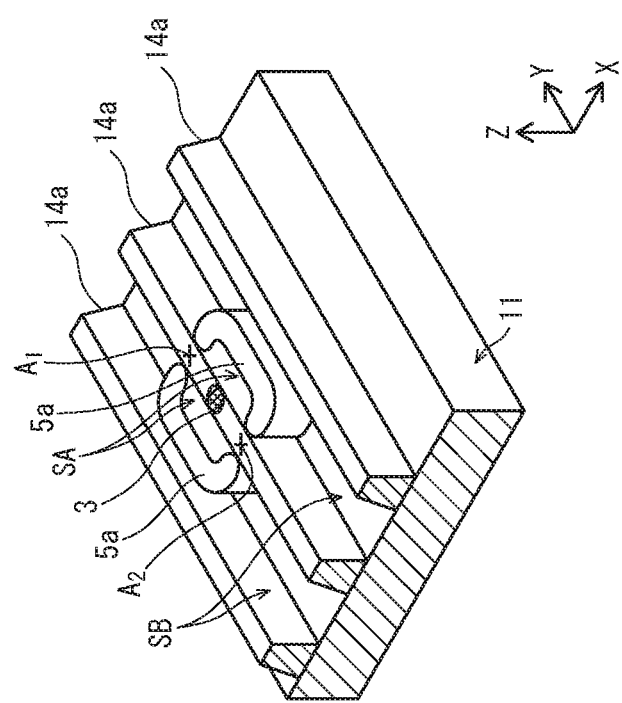
FIG. 14A
FIG. 14B

BANK REPAIR METHOD, ORGANIC EL DISPLAY DEVICE, AND PRODUCTION METHOD FOR SAME

TECHNICAL FIELD

The present invention pertains to a bank repair method, and to an organic electroluminescence (EL) display device and a manufacturing method thereof.

BACKGROUND ART

In recent years, the use of organic EL display panels including a substrate and a matrix of organic EL elements arranged over the substrate have been put into practical use. Such an organic EL display panel achieves high visibility due to the organic EL elements performing light emission individually. Also, such an organic EL display panel achieves excellent shock resistance due to the organic EL elements being completely solid-state elements.

Organic EL elements in a typical organic EL display panel have a basic structure in which a light-emitting layer containing an organic light-emitting material is disposed between an electrode pair composed of an anode and a cathode. The organic EL elements are driven through voltage application between these electrodes. The organic EL elements are current-driven light-emitting elements, emitting light when holes injected into the light-emitting layer from the anode and electrons injected into the light-emitting layer from the cathode recombine in the light-emitting layer.

In a typical organic EL display panel, a light-emitting layer of one organic EL element is partitioned from a light-emitting layer of an adjacent organic EL element by a bank formed from an electrically-insulative material.

Further, one or more organic layers, such as a hole injection layer, a hole transport layer, and a hole injection/transport layer are disposed as necessary between the anode and the light-emitting layer. Likewise, one or more organic layers, such as an electron injection layer, an electron transport layer, and an electron injection/transport layer are disposed as necessary between the cathode and the light-emitting layer.

In a full color organic EL display panel, a plurality of such organic EL elements are disposed, and each organic EL element serves as a red sub-pixel, a green sub-pixel, or a blue sub-pixel. Further, each pixel of a full-color organic EL display panel is composed of a set of red, green, and blue sub-pixels disposed next to one another.

The manufacturing of such an organic EL display panel involves a process of forming light-emitting layers and so on in concave spaces defined by banks, after forming the banks on the substrate. The forming of the light-emitting layers is often performed through a wet process of applying, to the concave spaces, an ink for light-emitting layer formation containing a macro-molecular material or a low-molecular material suitable for forming a thin film, through an inkjet method or a similar method. Such a wet process enables organic layers and light-emitting layers to be formed relatively easily, even in large panels.

CITATION LIST

Patent Literature

[Patent Literature 1]
WO Publication No. 2010/013654

SUMMARY OF INVENTION

Technical Problem

In an organic EL display panel such as that described above, a bank having a defect portion may be produced in the manufacturing process by a portion of the bank collapsing, adhesion of a foreign particle to the bank, or the like. The presence of a bank having a defect portion may cause inks of different colors, applied with respect to both sides of the bank having the defect portion in the process of forming fluorescent layers, to mix with one another.

When an organic EL display panel is manufactured using a panel in which such color mixture has occurred, the region of the organic EL display panel where color mixture has occurred may emit light with an undesired color, which results in display failures appearing in the manufactured organic EL display panel.

In view of this, there is a demand for a technology of repairing banks having defect portions and thereby preventing such display failures from occurring in display panels.

In view of the above-described problem, the present invention aims to provide a bank repair method, and an organic EL display device and a manufacturing method thereof that are capable of reducing display failures even when a bank having a defect portion is produced by bank collapse or a foreign particle.

Solution to Problem

In order to achieve this aim, one aspect of the present invention is a bank repair method for repairing a defect portion of a bank in a process of manufacturing an organic electroluminescence (EL) display device including a substrate, banks formed over the substrate, and light-emitting layers formed in concave spaces defined by the banks, the bank repair method including: examining whether or not a bank having a defect portion is present; and when a bank having a defect portion is present, forming a dam in each of adjacent concave spaces between which the bank having the defect portion is located, a dam formed in a concave space partitioning the concave space into a first space in a vicinity of the defect portion and a second space outside the vicinity of the defect portion.

Note that the dam, formed in the vicinity of the defect portion, should not be considered as being a bank, a plurality of which is formed over the entire display area of the display device. Accordingly, for example, in a pixel bank structure composed of first banks and second banks perpendicular to the first banks, the second banks should not be considered as corresponding to the dam, although the second banks partition the concave spaces defined by the first banks.

Also, the banks are formed so as to define individual pixels or sub-pixels. However, the dam can be formed within a pixel or a sub-pixel.

Advantageous Effects of Invention

According to the bank repair method pertaining to one aspect of the present invention, a dam formed in a concave space partitions an ink layer formed by applying ink for forming a light-emitting layer in the concave space.

Note that in the first space, which is in the vicinity of the defect portion, adjacent ink layers between which the bank having the defect portion is located may mix via the defect portion. However, this region where ink mixture occurs does not spread to the second space, due to the second space, which is outside the vicinity of the defect portion, being partitioned from the first space by the dam.

Accordingly, manufacturing an organic EL display device using a bank repaired by this bank repair method confines the region in which color mixture occurs due to ink layers mixing via a defect portion within a first space, which is in the vicinity of the defect portion. As such, display failures are prevented from occurring in the organic EL display device.

Each of FIG. 5A through FIG. 5G is a schematic cross-sectional view illustrating a procedure of the manufacturing process of the display panel 100.

Figure 6A:
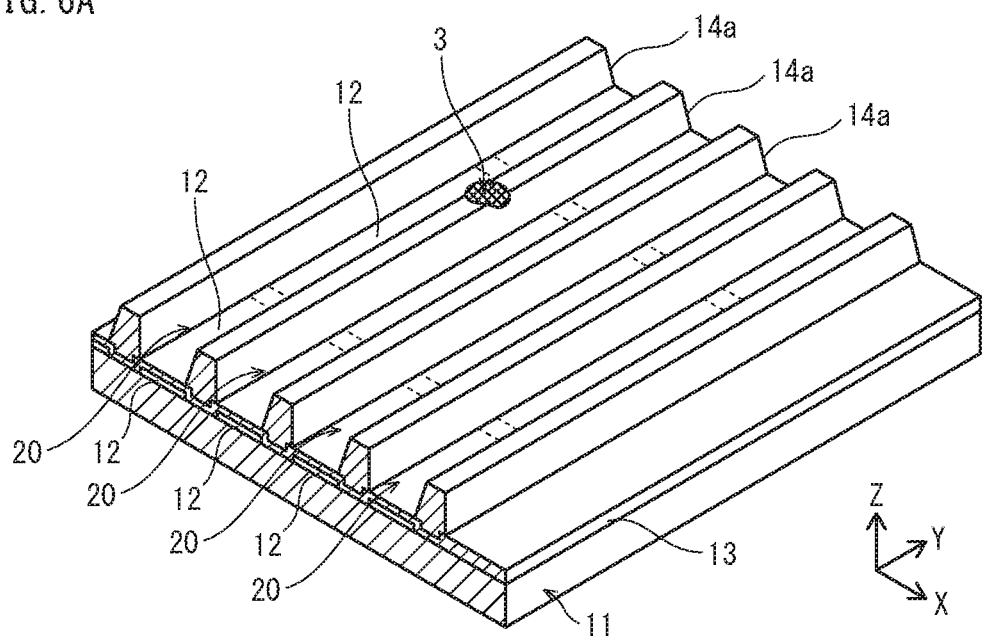
Figure 6B:
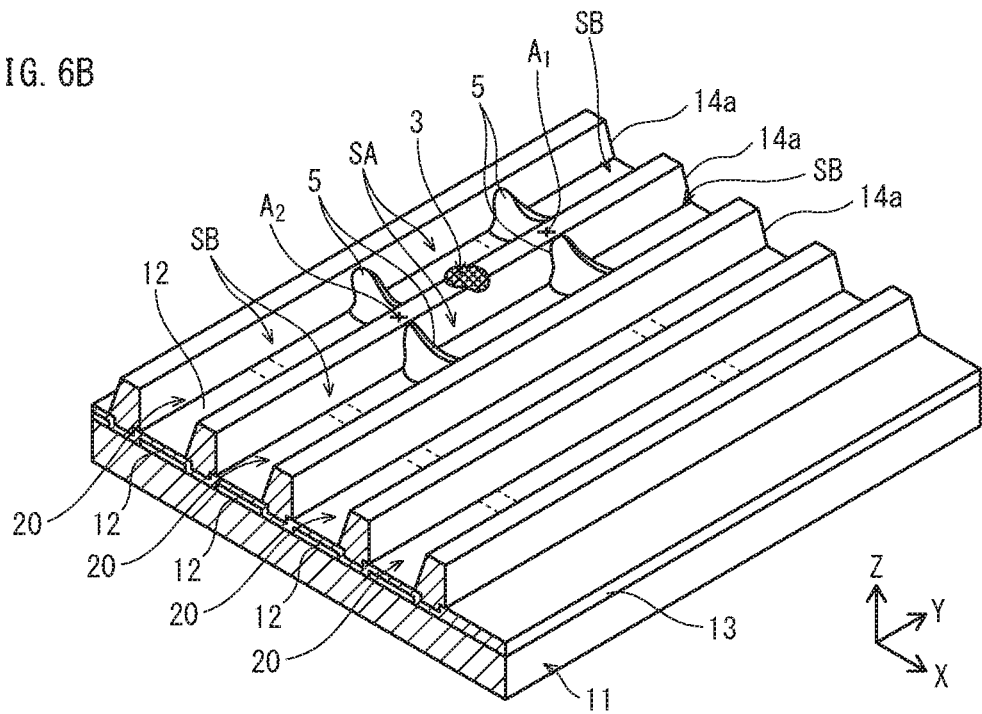

FIG. 6A is a perspective view illustrating an example of a bank defect portion, and FIG. 6B is a perspective view illustrating dams pertaining to Embodiment 1 formed around the defect portion.

Figure 7A:
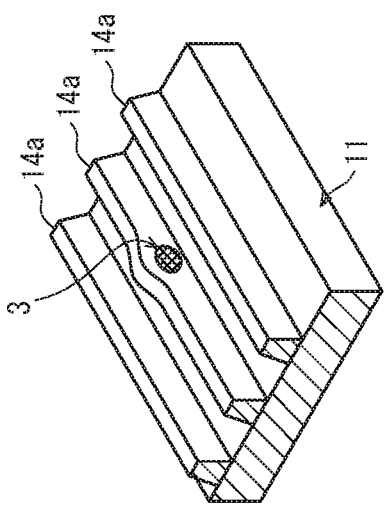
Figure 7B:
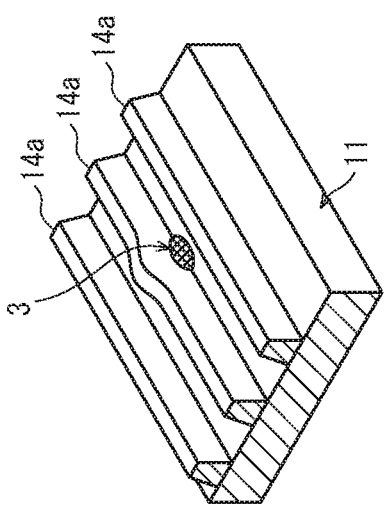
Figure 7C:
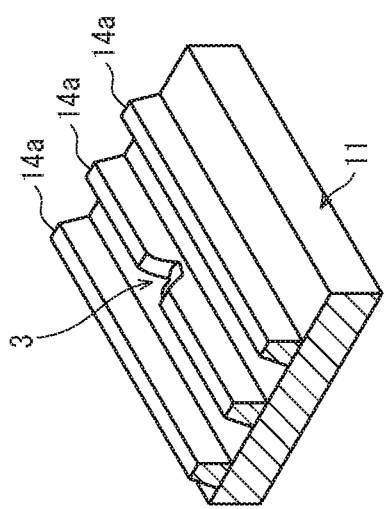

FIG. 7A and FIG. 7B each illustrate a bank defect portion produced by a foreign particle, and FIG. 7C illustrates a bank defect portion produced by a bank collapsing.

Figure 8:
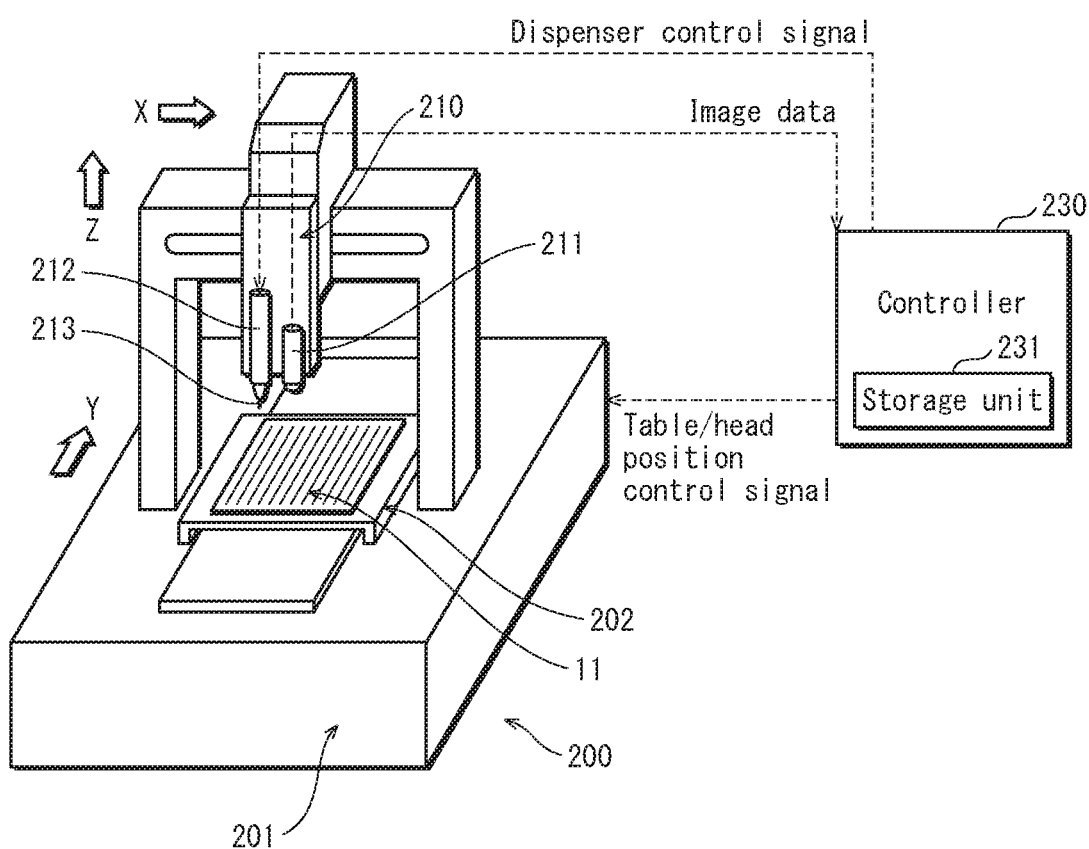

FIG. 8 illustrates the overall structure of one example of a repair device used for bank defect detection and bank repair.

Figure 9A:
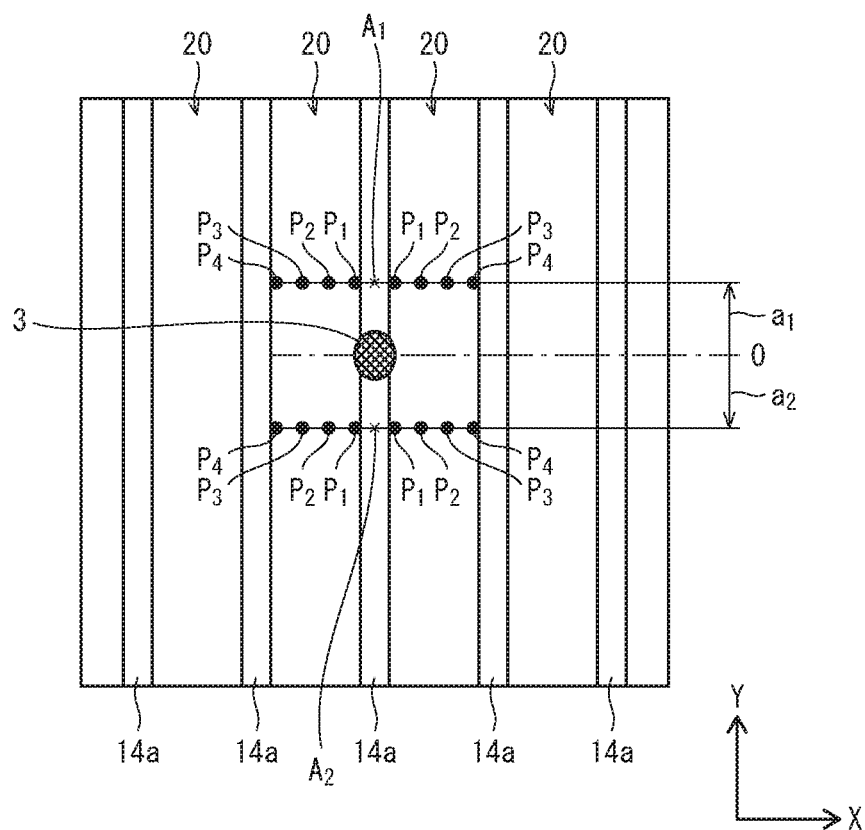
Figure 9B:
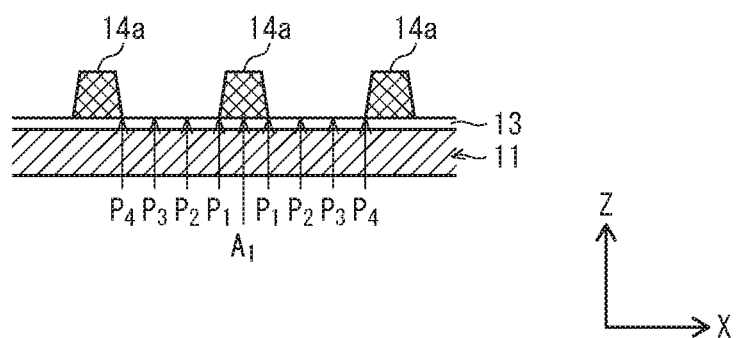

FIG. 9A and FIG. 9B illustrate application positions set in an image of a vicinity of a defect portion.

FIG. 10A through FIG. 10G illustrate how a dam is formed through application of a repair material.

Figure 11B:
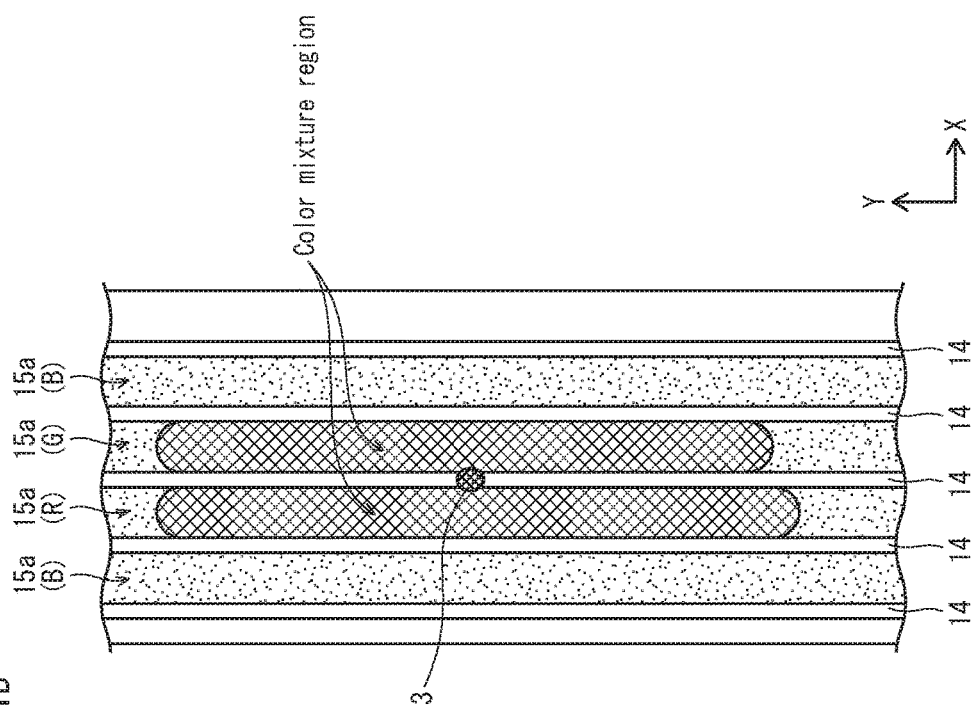
Figure 11A:
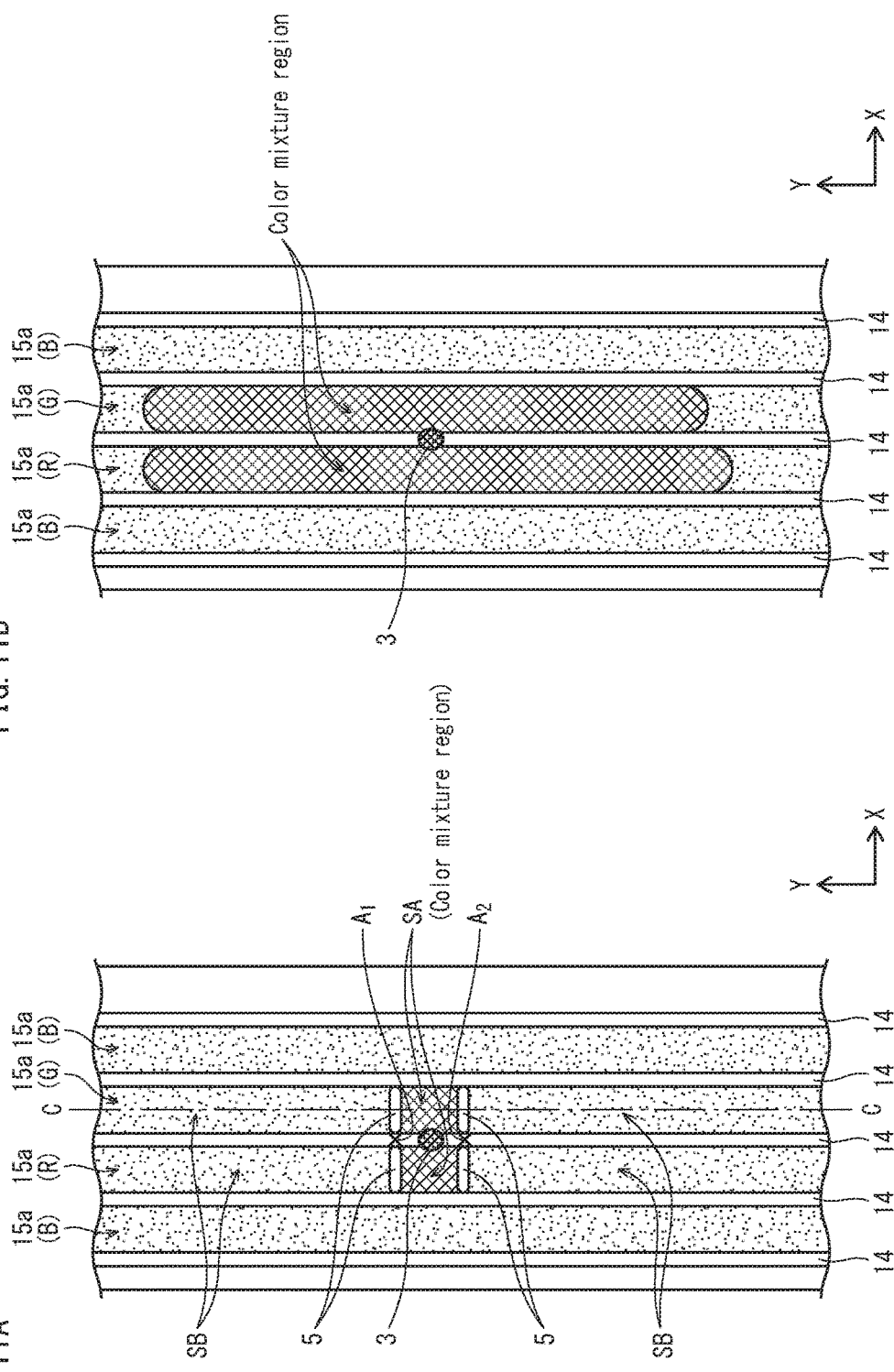

FIG. 11A and FIG. 11B illustrate the effects of forming dams pertaining to Embodiment 1, where FIG. 11A illustrates a state where the dams are formed and FIG. 11B illustrates a comparative example where the dams are not formed.

Figure 12:
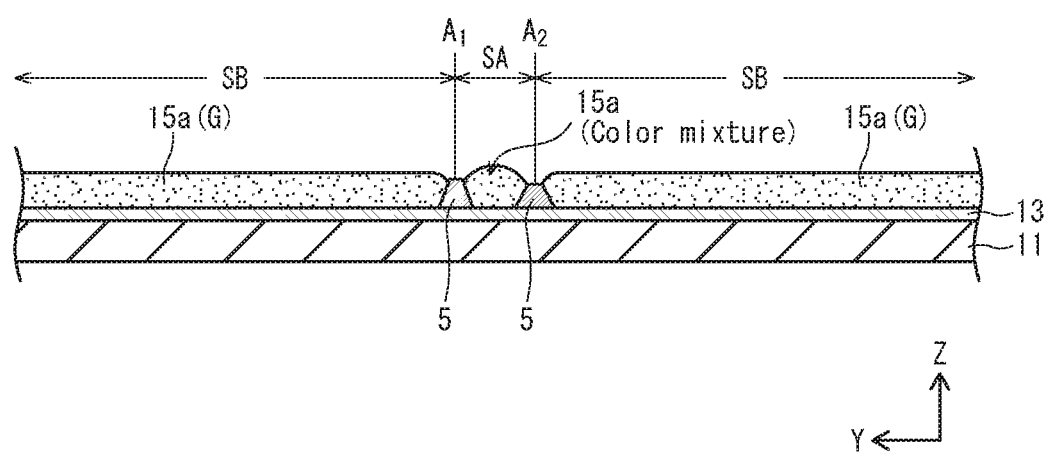

FIG. 12 is a cross-sectional view taken along line C-C of FIG. 11A.

Figure 13A:
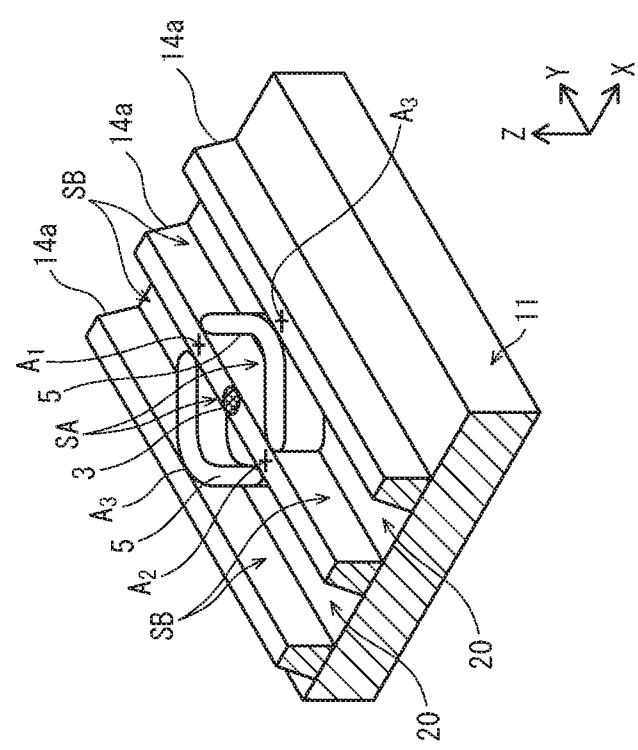
Figure 13B:
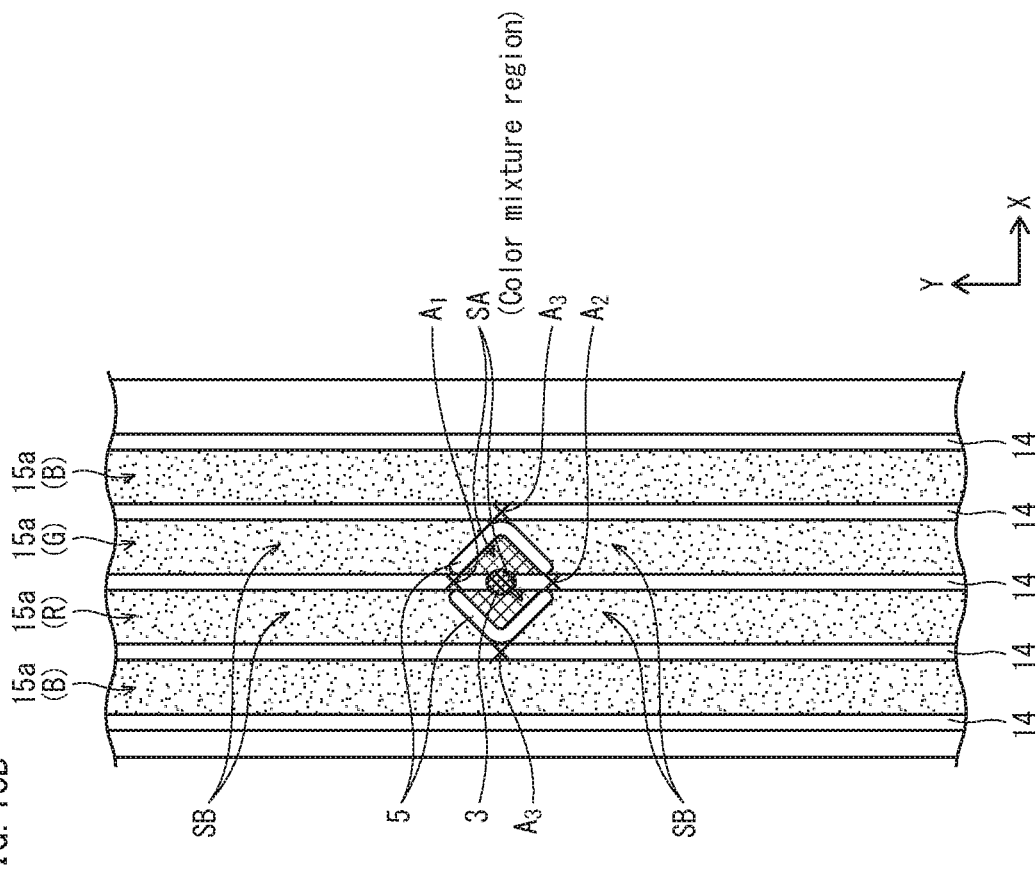

FIG. 13A illustrates the shape of dams pertaining to Embodiment 2, and FIG. 13B is a plan view diagram illustrating a state where ink layers have been formed after the dams have been formed in groove spaces.

FIG. 14A is a perspective view diagram illustrating the shape of dams pertaining to Embodiment 3, and FIG. 14B is a plan view diagram illustrating a state where ink layers have been formed after the dams have been formed in groove spaces.

Figure 15B:
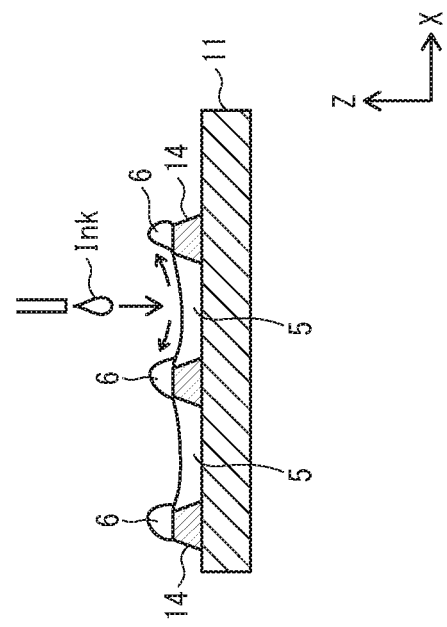
Figure 15A:
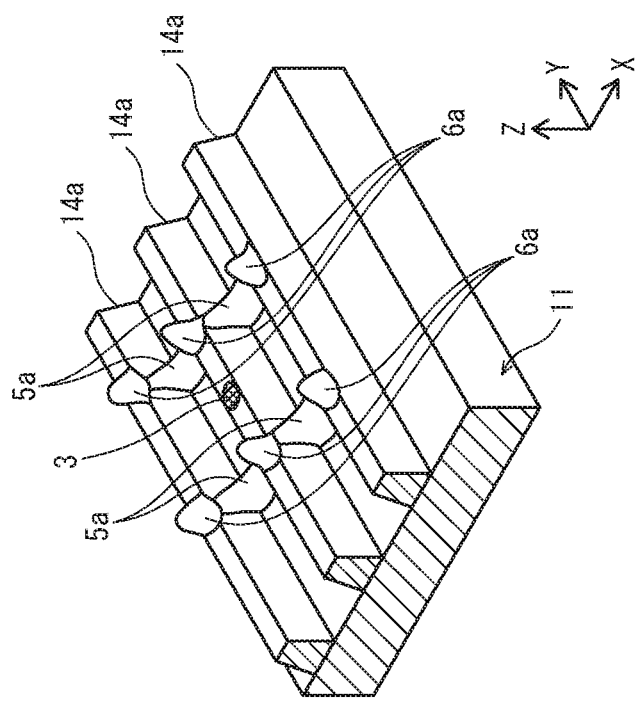

FIG. 15A is a perspective view illustrating the shapes of dams pertaining to Embodiment 4, and FIG. 15B is a cross-sectional diagram illustrating the application of fluorescent ink after the dams have been formed in groove spaces.

FIG. 16A through FIG. 16D each illustrate an example of a repair of a defect portion having occurred in a bank in a display panel having a pixel bank structure.

DESCRIPTION OF EMBODIMENTS (Background Leading to Disclosure)

For example, Patent Literature 1 discloses a technology of, after banks have been formed and before ink is applied in the manufacturing of a flat display substrate, repairing a collapsed portion of a bank by removing a portion of the bank around the collapsed portion, and applying a bank repair liquid containing an ink-repellent polymer to the removed portion.

When a bank has a collapsed portion, it can be expected that the mixture of different inks that would otherwise occur due to the collapsed portion can be prevented by repairing the collapsed portion according to such technology and then performing ink application.

However, a bank defect portion may be produced by a foreign particle adhering to a bank, rather than collapsing of a bank. It is considered difficult to repair such a defect portion according to the above-described conventional technology of applying polymer material. For example, the foreign particle may repel the polymer liquid applied for repairing the defect portion, and the defect portion may not be repaired appropriately.

Meanwhile, according to observations by the present inventors, organic EL display devices nowadays have very narrow banks, with widths of around 10 μm. Further, it can be expected that bank width will become even smaller in the future as pixel definition increases. Thus, there is technical difficulty in repairing banks through positioning application needles with respect to collapsed portions of banks.

Furthermore, a repair method as described in Patent Literature 1 may result in the polymer contained in a repaired portion of a bank repelling ink applied later. When this occurs, the applied ink repelled by the polymer at the repaired portion may be urged into an adjacent light-emitting layer, which results in the occurrence of color mixture.

In consideration of the above, the present inventors considered how bank defect portions, particularly in high-definition EL display devices, can be repaired with ease, to prevent light-emission color failures from appearing.

Here, the present inventors focused on the fact that the main problem arising when a bank defect portion is produced is not the existence of the defect portion itself, but light-emission color failure occurring at a color mixture region of a manufactured panel, which is formed by mixing of inks of different colors for forming light-emitting layers.

Based on this, the present inventors found that the problem of light-emission color failure is resolvable without repairing the defect portion itself, and by preventing the spread of the color mixture region by providing dams within concave spaces in the vicinity of the defect portion. Thus, the present inventors arrived at the present invention.

Aspects of Invention

One aspect of the present invention is a bank repair method for repairing a defect portion of a bank in a process of manufacturing an organic electroluminescence (EL) display device including a substrate, banks formed over the substrate, and light-emitting layers formed in concave spaces defined by the banks, the bank repair method including: examining whether or not a bank having a defect portion is present; and when a bank having a defect portion is present, forming a dam in each of adjacent concave spaces between which the bank having the defect portion is located, a dam formed in a concave space partitioning the concave space into a first space in a vicinity of the defect portion and a second space outside the vicinity of the defect portion.

According to this structure, an ink layer formed by applying ink for forming a light-emitting layer in a concave space in which the dam is formed is partitioned by the dam. Thus, the region in which ink mixture occurs does not spread beyond the second space, which is outside the vicinity of the defect portion. As such, display failure of the organic EL display device is prevented.

Also, according to this structure, the dam is formed around the defect portion. Thus, the dam is relatively easy to form even if the defect portion is produced by a foreign particle.

The bank repair method pertaining to one aspect of the present invention may also be modified as follows.

The banks all extend in one direction along a surface of the substrate and each have a rectangular shape in plan view, and appear as a plurality of parallel lines in plan view, and the dam in each of the adjacent concave spaces is a pair of dams, the dams each extending from a different one of two points of the bank having the defect portion to an adjacent bank, the defect portion being located between the two points in the one direction.

Further, protruding portions are formed protruding from upper portions of bank portions in contact with the dams. The bank portions include portions of the bank having the defect portion that are in contact with end portions of the dams and portions of the adjacent bank that are in contact with end portions of the dams. Accordingly, even if ink arrives on the dam, color mixture occurring due to the ink entering an adjacent concave space is prevented.

The banks all extend in one direction along a surface of the substrate and each have a rectangular shape in plan view, and appear as a plurality of parallel lines in plan view, and the dam in each of the adjacent concave spaces is a single dam extending between two points of the bank having the defect portion while detouring around the defect portion, the defect portion being located between the two points in the one direction.

Here, the single dam may be in contact with a bank adjacent to the bank having the defect portion at some point along a path between the two points, or the single dam may not be in contact with a bank adjacent to the bank having the defect portion.

Further, the defect portion may be a portion of a bank where a foreign particle is present or a portion of a bank having collapsed.

One aspect of the present invention is an organic electroluminescence (EL) display device including: a substrate; banks formed over the substrate; and light-emitting layers disposed in concave spaces defined by the banks. In the organic EL display device, a dam is disposed in each of adjacent concave spaces between which a bank having a defect portion is located. A dam disposed in a concave space partitioning a light-emitting layer disposed in the concave space into a first light-emitting layer in a vicinity of the defect portion and a second light-emitting layer outside the vicinity of the defect portion.

According to this organic EL display device, an ink layer formed by applying ink for forming a light-emitting layer in a concave space in which the dam is formed is partitioned by the dam. Thus, the region in which ink mixture occurs is confined within the first light-emitting layer, which is in the vicinity of the defect portion, and does not spread to the second light-emitting layer, which is outside the vicinity of the defect portion. Accordingly, display failure of the organic EL display device is prevented, and the organic EL display device has excellent display performance.

Also, since the dam is formed around the defect portion, the formation of the dam is relatively easy.

The above-described organic EL display device may also be modified as follows.

The banks all extend in one direction along a surface of the substrate and each have a rectangular shape in plan view, and appear as a plurality of parallel lines in plan view, and the dam in each of the adjacent concave spaces is a pair of dams, the dams each extending from a different one of two points of the bank having the defect portion to an adjacent bank, the defect portion being located between the two points in the one direction.

Further, protruding portions are formed protruding from upper portions of bank portions in contact with the dams. The bank portions include portions of the bank having the defect portion that are in contact with end portions of the dams and portions of the adjacent bank that are in contact with end portions of the dams.

The banks all extend in one direction along a surface of the substrate and each have a rectangular shape in plan view, and appear as a plurality of parallel lines in plan view, and the dam in each of the adjacent concave spaces is a single dam extending between two points of the bank having the defect portion while detouring around the defect portion, the defect portion being located between the two points in the one direction.

Here, the single dam may be in contact with a bank adjacent to the bank having the defect portion at some point along a path between the two points, or may not be in contact with a bank adjacent to the bank having the defect portion.

Further, the defect portion may be a portion of a bank where a foreign particle is present or a portion of a bank having collapsed.

Further, the first light-emitting layer may contain materials of adjacent second light-emitting layers between which the bank having the defect portion is located.

One aspect of the present invention is a method for manufacturing an organic EL display device by forming banks over a substrate and forming light-emitting layers in concave spaces defined by the banks, the method including: examining whether or not a bank having a defect portion is present; when a bank having a defect portion is present, forming a dam in each of adjacent concave spaces between which the defect portion is located, a dam formed in a concave space partitioning the concave space into a first space in a vicinity of the defect portion, and a second space outside the vicinity of the defect portion; and forming the light-emitting layers after forming the dam.

According to this manufacturing method, similarly to the above-described bank repair method, an ink layer formed through the formation of the light-emitting layer by applying ink in a concave space in which the dam is formed is partitioned. Thus, the region in which ink mixture occurs does not spread into the second space, which is outside the vicinity of the defect portion. As such, display failure of the organic EL display device is prevented.

Also, according to this structure, the dam is formed around the defect portion. Thus, the dam is relatively easy to form even if the defect portion is produced by a foreign particle.

In the method pertaining to one aspect of the present invention, the dam may be formed to be spaced away from the defect portion, and in the forming of the light-emitting layers, a portion of a light-emitting layer may be formed in the space between the dam and the defect portion.

Embodiment 1

[Overall Structure of Organic EL Display Device]

Figure 1:
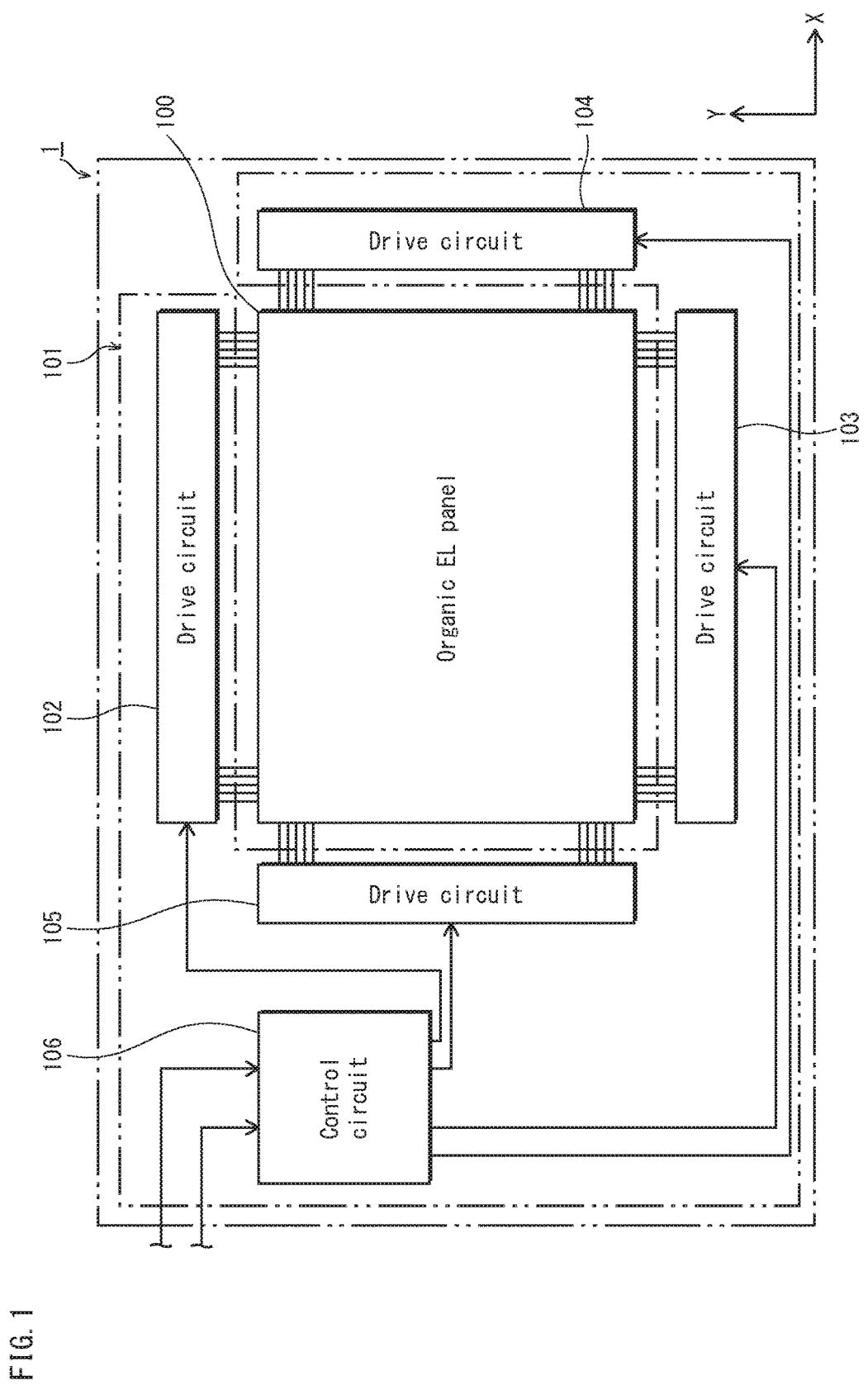
FIG. 1 is a schematic block diagram illustrating the structure of an organic EL display device 1.

FIG. 1 is a schematic block diagram illustrating the structure of an organic EL display device 1 having a display panel 100 pertaining to Embodiment 1.

Figure 2:
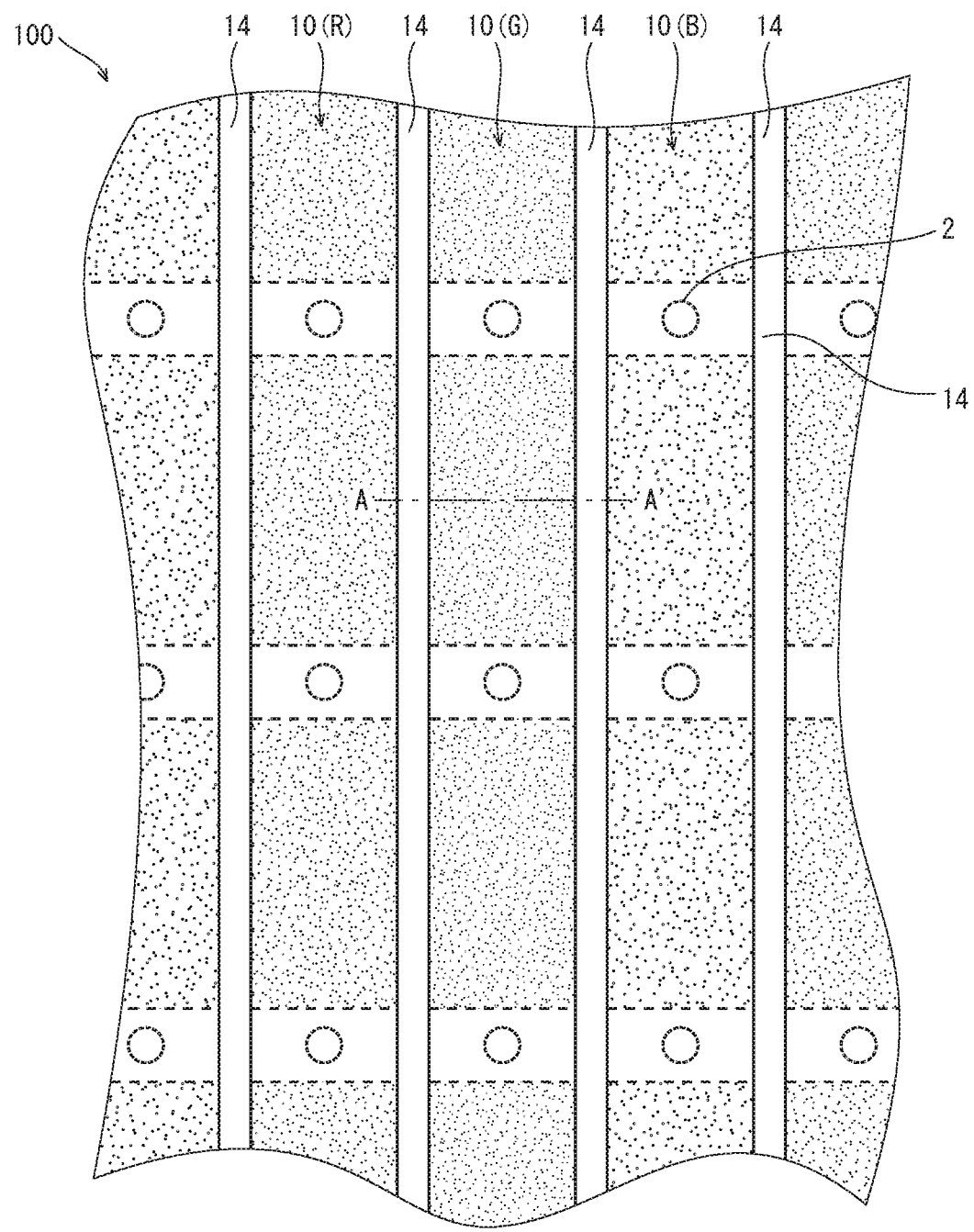
FIG. 2 is a plan view illustrating a part of an organic EL display panel 100.

As illustrated in FIG. 1, the organic EL display device 1 includes the display panel 100 and a drive controller 101 connected thereto. The display panel 100 is a panel using the electroluminescence effect of an organic material. In the display panel 100, organic EL elements 10 are arranged over a substrate to form a matrix, as illustrated in FIG. 2. The drive controller 101 includes four drive circuits, namely drive circuits 102, 103, 104, and 105, and a control circuit 106.

The arrangement of the drive controller 101 with respect to the display panel 100 is not limited to that illustrated in FIG. 1.

[Structure of Organic EL Display Panel]

Figure 3:
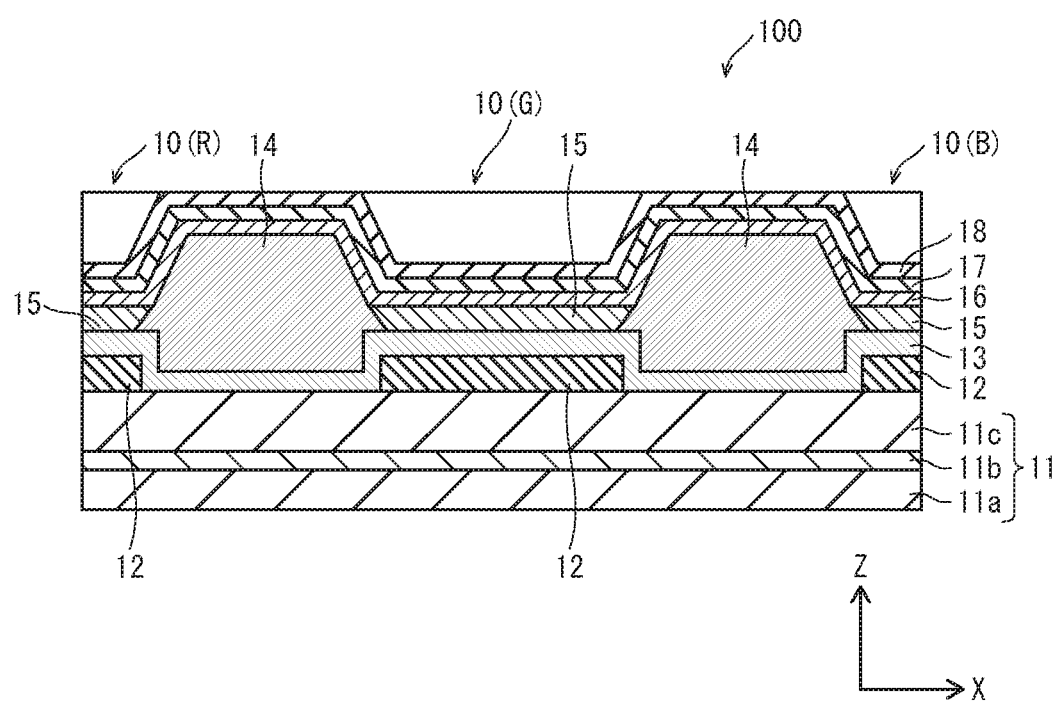
FIG. 3 is a cross-sectional view illustrating a part of the display panel 100 taken along line A-A' of FIG. 2, in magnified state.

FIG. 2 schematically illustrates the overall structure of the display panel 100, when viewed in plan view from above a display surface thereof. FIG. 3 is a cross-sectional view illustrating a part of the display panel 100 taken along line A-A' of FIG. 2, in magnified state. The display panel 100 is a top-emission-type panel, and the display surface of the display panel 100 is located in the Z direction.

The following describes the structure of the display panel 100, with reference to FIG. 2 and FIG. 3.

As illustrated in FIG. 3, the display panel 100 includes, as main components thereof, a ground substrate 11, pixel electrodes 12, a hole injection layer 13, banks 14, organic light-emitting layers 15, an electron transport layer 16, a common electrode 17, and a sealing layer 18. Each organic EL element 10 includes an organic light-emitting layer 15 of a corresponding light-emission color, which is either red (hereinafter, R), green (hereinafter, G), or blue (hereinafter, B). Each organic EL element 10 serves as a sub-pixel. As illustrated in FIG. 2, sub-pixels are disposed in a matrix.

FIG. 2 illustrates a state where the electron transport layer 16, the common electrode 17, and the sealing layer 18 are removed.

[Ground Substrate]

The ground substrate 11 includes a substrate body 11a, thin-film transistor (hereinafter, TFT) layers 11b, and an interlayer insulation layer 11c.

The substrate body 11a serves as the base of the display panel 100, and may be formed by using, for example, an electrically-insulating material such as non-alkali glass, soda glass, polycarbonate resin, polyester resin, or aluminum oxide.

The TFT layers 11b are provided one-to-one for sub-pixels, on the surface of the substrate body 11a. Each TFT layer 11b has formed therein a pixel circuit that includes a TFT element.

The interlayer insulation layer 11c is formed on the TFT layers 11b. The interlayer insulation layer 11c is formed by using an organic electrically-insulative material such as a polyimide resin, an acrylic resin, or a novolac-type phenol resin, or an inorganic electrically-insulative material such as SiO (silicon oxide) or SiN (silicon nitride), and so on. The interlayer insulation layer 11c secures electrical insulation between the TFT layers 11b and the pixel electrodes 12. In addition, the interlayer insulation layer 11c planarizes any level difference on the top surfaces of the TFT layers 11b, and thereby suppresses the influence that such level differences would otherwise have with respect to the surface on which the pixel electrodes 12 are formed.

[Pixel Electrodes]

The pixel electrodes 12 are provided one-to-one for sub-pixels, on the ground substrate 11, and are formed by using an optically-reflective electrically-conductive material such as Ag (silver), Al (aluminum), aluminum alloy, Mo (molybdenum), or APC (an alloy of silver, palladium, and copper). In the present Embodiment, the pixel electrodes 12 serve as anodes.

A conventional light-transmissive electrically-conductive film may be additionally provided on the surface of each pixel electrode 12. This light-transmissive electrically-conductive film may be formed, for example, by using indium tin oxide (ITO) or indium zinc oxide (IZO). The light-transmissive electrically-conductive films are disposed between the pixel electrodes 12 and the hole injection layer 13, and serve to improve inter-layer joining.

[Hole Injection Layer]

The hole injection layer 13 is formed, for example, by using an oxide of a metal such as silver (Ag), molybdenum (Mo), chromium (Cr), vanadium (V), tungsten (W), nickel (Ni), or iridium (Ir), or an electrically-conductive polymer material such as PEDOT (a mixture of polythiophene and polystyrene sulfate). The hole injection layer 13, when formed by using a metal oxide, assists hole generation and ensures stable injection and transportation of holes to the organic light-emitting layers 15.

[Banks]

A plurality of parallel, linear banks 14 are provided on the surface of the hole injection layer 13. In plan view, each of the banks 14 is elongated and extends in the Y direction, and has a rectangular shape. The banks 14 are formed by using an organic electrically-insulative material (for example, an acrylic resin, a polyimide resin, or a novolac-type phenol resin).

As illustrated in FIG. 3, each of the banks 14 has a trapezoidal cross-section. Further, a pair of banks 14 defines a groove space in which organic light-emitting layers 15 are disposed.

The banks 14 serve as structural members that, when a wet process is performed for forming the organic light-emitting layers 15, prevent applied ink from overflowing.

[Organic Light-Emitting Layers]

The organic light-emitting layers 15 emit light through the recombination of carriers (i.e., holes and electrons) occurring therein, and each contain an organic material corresponding to one of the colors R, G, and B.

The organic light-emitting layers 15 are disposed in the concave spaces (refer to the groove spaces 20 illustrated in FIGS. 6A and 6B), which are partitioned from one another by the banks 14, are elongated and extend in the Y direction, and have groove-like shapes.

Further, each bank 14 is disposed between two groups of organic light-emitting layers 15, which differ in terms of color.

The material for the organic light-emitting layers 15 may be formed, for example, by using a fluorescent substance such as polyphenylene vinylene (PPV), polyfluorene, oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group III metal, metal complex of oxine, or rare earth metal complex.

[Electron Transport Layer]

The electron transport layer 16 transports electrons injected thereto from the common electrode 17 to the organic light-emitting layers 15, and is formed by using, for example, an oxidiazole derivative (OXD), a triazole derivative (TAZ), or a phenanthroline derivative (BCP, Bphen).

[Common Electrode]

The common electrode 17 is, for example, formed by using a light-transmissive material having electrically-conductive properties, such as ITO or IZO. The common electrode 17 extends across all sub-pixels.

In the present Embodiment, the common electrode 17 serves as a cathode.

[Sealing Layer 18]

The sealing layer 18 is provided to protect the hole injection layer 13, the organic light-emitting layers 15, the electron transport layer 16, and the common electrode 17 from water and oxygen.

Although not depicted in the drawings, black matrices, color filters, and/or the like may also be formed over the sealing layer 18.

[Display Panel Manufacturing Method]

Figure 4:
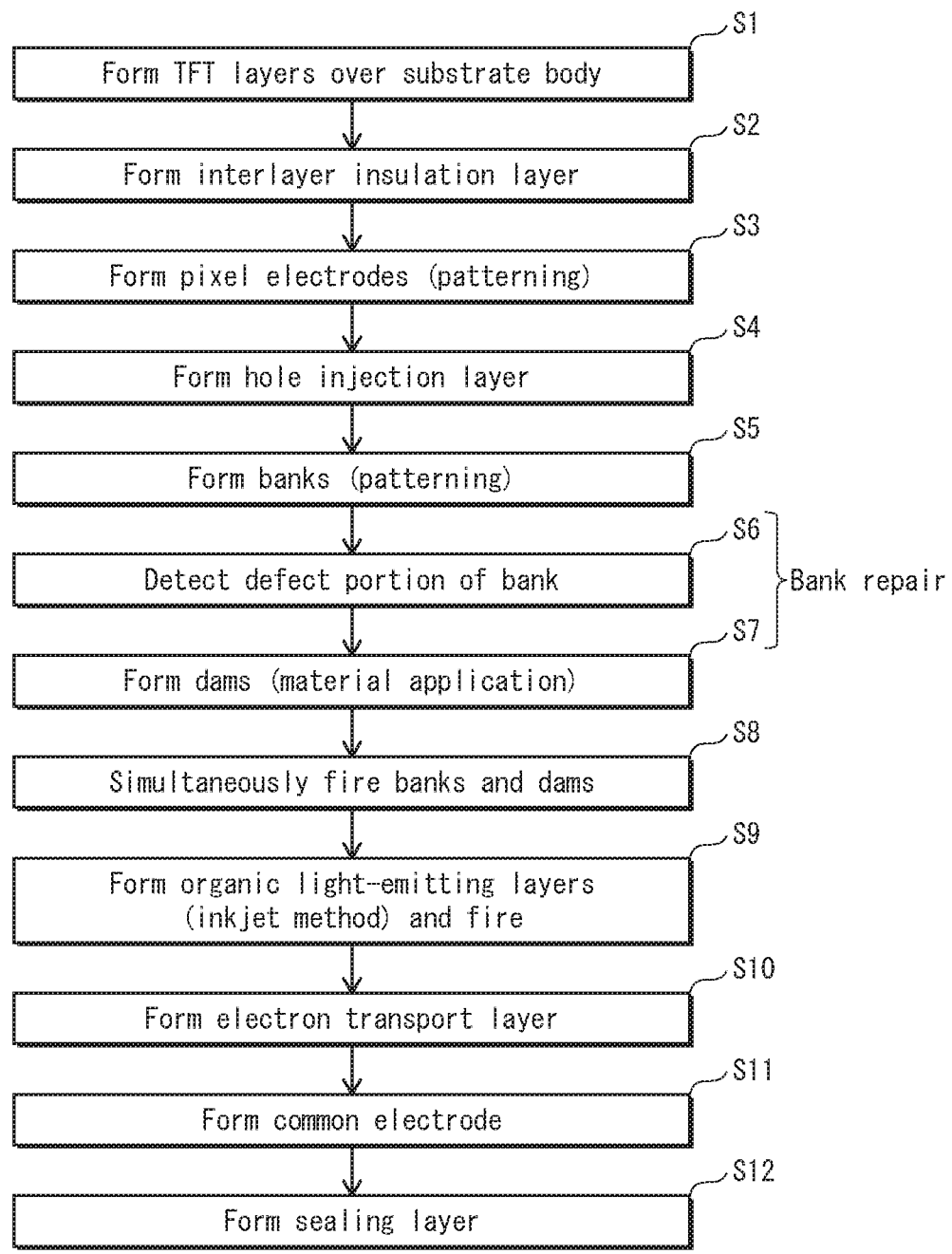
FIG. 4 schematically illustrates procedures of a manufacturing process of the display panel 100.

FIG. 4 is a schematic process diagram illustrating a manufacturing process of the display panel 100.

Each of FIG. 5A through FIG. 5G is a schematic cross-sectional view illustrating a procedure of the manufacturing process of the display panel 100.

The manufacturing method of the display panel 100 is described in accordance with FIG. 4, which illustrates the procedures involved in the manufacturing process, and with further reference to FIG. 3 and FIG. 5A through FIG. 5G.

First, the TFT layers 11b are formed on the substrate body 11a (step S1).

Subsequently, the interlayer insulation layer 11c is formed on the TFT layers 11b by using an organic material providing excellent electrical insulation and through a photoresist method, with which the ground substrate 11 is yielded (step S2). The thickness of the interlayer insulation layer 11c is approximately 4 μm, for example. Although not depicted in the cross-sectional view of FIG. 3 nor in FIG. 4, which illustrates the procedures involved in the manufacturing process, contact holes 2 (see FIG. 2) are also formed during the forming of the interlayer insulation layer 11c.

Next, the pixel electrodes 12 are formed, one for each sub-pixel, from a metallic material having a thickness of approximately 400 nm, through vacuum vapor deposition or sputtering (step S3).

Then, the hole injection layer 13 is formed by uniformly forming a film of tungsten oxide over the ground substrate 11 and the pixel electrodes 12 through sputtering or the like (step S4).

Subsequently, the banks 14 are formed (step S5). The banks 14 may be formed through photolithography, as described in the following.

First, a negative photosensitive resin composition is prepared for use as a bank material. As illustrated in FIG. 5A, the bank material is applied uniformly over the hole injection layer 13.

Then, as illustrated in FIG. 5B, a mask having openings matching the pattern of the banks 14 is placed over the layer of the applied bank material, and irradiation with light is performed from over the mask.

Subsequently, the forming of a bank pattern is completed by washing away any excess bank material with an alkaline developing fluid and patterning the bank material. Unfired banks 14a are formed as a result of such patterning, as illustrated in FIG. 5C. At this point, a groove space 20 has already been formed between each pair of adjacent banks 14a.

Next, the unfired banks 14a, formed through the above-described patterning, are examined to detect any unfired bank 14a having a defect portion (step S6). If an unfired bank 14a having a defect portion is detected, the defect portion is repaired.

This repair is described in more detail later. Broadly speaking, a repair material is applied with respect to groove spaces 20 in the vicinity of the defect portion, and then the applied repair material is dried (step S7). FIG. 5D illustrates a state where uniformed dams 5a have been formed by applying the repair material with respect to groove spaces 20.

Then, the banks 14 and dams 5 are respectively produced by simultaneous thermal firing of the unfired banks 14a and the unfired dams 5a, thereby completing the repair of a defect portion 3 (step S8). The simultaneous firing is, for example, performed by heating the unfired banks 14a and the unfired dams 5a at a temperature between 150° C. and 210° C. for 60 minutes.

FIG. 5E illustrates a state where the banks 14 and the dams 5 have been formed by this firing, or in other words, a state where a repaired bank 14 has been formed.

The banks 14 manufactured in this manner may be further subjected to a process of adjusting contact angle with respect to ink to be applied in the subsequent process. Alternatively, in order to provide hydrophobic properties to the surfaces of the banks 14, processing such as surface processing using a predetermined alkaline solvent, water, an organic solvent, etc., or plasma processing may be applied.

Next, inks for forming light-emitting layers are applied with respect to the groove spaces 20, as illustrated in FIG. 5F. Each ink is a mixture of an organic material for the corresponding organic light-emitting layers 15 and a solvent, and is applied with respect to the inside of groove spaces 20 using an inkjet method.

Ink layers 15a formed through the ink application are then dried by causing the solvent contained in the ink layers 15a to evaporate, and thermal firing is performed when necessary. Thus, the organic light-emitting layers 15 are formed in the groove spaces 20, as illustrated in FIG. 5G (step S9).

Next, the electron transport layer 16 is formed over the organic light-emitting layers 15 and the banks 14 by depositing a film of a material for the electron transport layer 16 through vacuum vapor deposition (step S10).

The common electrode 17 is then formed by depositing a film of a material such as ITO or IZO through sputtering or the like (step S11).

Then, the sealing layer 18 is formed by depositing a film of a light-transmissive material such as SiN or SiON over the surface of the common electrode 17 through sputtering, CVD, or the like (step S12).

The manufacturing of the display panel 100 is completed through the above-described procedures.

[Method for Detecting and Repairing Bank with Defect Portion]

As described above in connection with the manufacturing method, but in more precise terms, the banks 14 and the dams 5 are respectively formed by thermal firing and curing of the unfired banks 14*a* and the unfired dams 5*a* having been formed. However, the unfired banks 14*a* and the unfired dams 5*a* are somewhat solidified and already have stable shapes. As such, in the present specification, description is provided while simply referring to the unfired banks 14*a* and the unfired dams 5*a* as the banks 14*a* and the dams 5*a*, respectively.

[Defect Portion 3]

First, a defect portion 3 of a bank 14*a* is described.

A defect portion 3 of a bank 14*a* may be a foreign particle present at the bank 14*a*, or may be a missing portion of the bank 14*a*.

The foreign particle may be, for example, a piece of metal originating in manufacturing equipment, or dust/dirt originating in the atmosphere. The dust/dirt tends to be a piece of fabric.

FIG. 6A illustrates an example in which a foreign particle has adhered onto one bank 14*a* and has become a defect portion 3.

When dome-shaped ink layers 15*a* are formed as illustrated in FIG. 5F by applying ink with respect to adjacent groove spaces 20 between which a bank 14*a* having a foreign particle is located, there is a risk of the ink layers 15*a* coming in contact with the foreign particle. Consequently, inks of different light-emission colors (e.g., red ink and green ink) may mix.

For example, as illustrated in FIG. 7A, the defect portion 3 may be a foreign particle that has entered the inside of the bank 14*a* and penetrates through a wall surface of the bank 14 from one groove space to an adjacent groove space.

For example, as illustrated in FIG. 7B, the defect portion 3 may be a foreign particle that has slipped beneath the bank 14*a* and penetrates the bank 14*a* from one groove space to an adjacent groove space.

With a foreign particle inside or beneath a bank 14*a*, a gap serving as an ink flow channel may be formed given poor adhesion between the foreign particle and the bank material. Particularly, when the foreign particle is a piece of fabric, the foreign particle itself unfortunately serves as an ink flow channel. As such, even when the defect portion 3 is a foreign particle inside or beneath a bank 14*a*, the defect portion 3 may bring about color mixture between ink layers 15*a* formed in adjacent groove spaces between which the foreign particle is located.

FIG. 5C illustrates an example where a portion of one bank 14*a* has collapsed and has become a defect portion 3. A portion of a bank 14*a* may collapse in such a manner, for example, when a portion of a bank material layer not having undergone sufficient polymerization in the bank material layer light exposure process illustrated in FIG. 5B, due to not being exposed to enough light, is washed away during the subsequent developing process. Even when the defect portion 3 is a collapsed portion of the bank 14*a*, the collapsed portion may mediate color mixture between ink layers 15*a* formed in adjacent groove spaces between which the collapsed portion is located.

When the display panel 100 is manufactured using a panel whose fluorescent layer has a color mixture region, the color mixture region emits light of a color differing from the originally intended color. Typically, when fluorescent substances of different light-emission colors are mixed, the light-emission color having longer wavelength becomes dominant.

For example, a color mixture region produced through mixing of red ink and green ink, such as the color mixture region illustrated in FIG. 11B, emits red light. Accordingly, a color mixture region formed in a region intended to emit green light turns out to emit red light, and thus, when the color mixture region spreads, light-emission color failure may occur.

As described above, mixture of inks of different light-emission colors occurs at a portion of a bank 14*a* where a foreign particle is present and at a collapsed portion of a bank 14*a*, and the mixture of such inks may lead to light-emission color failure. As such, such portions of banks 14*a* are referred to as defect portions 3 of the banks 14*a*.

Further, when a foreign particle is present inside or beneath a bank 14*a* as illustrated in FIG. 7A and FIG. 7B, the bank 14*a* bulges upwards and has relatively great height at the portion where the foreign particle is present. Meanwhile, when a portion of a bank 14*a* has collapsed as illustrated in FIG. 7C, the bank 14 has relatively small height at the portion.

[Detection of Defect Portion 3]

The detection of a bank 14*a* having a defect portion 3 is performed by, for example, capturing an image of the surfaces of the banks 14*a* formed over the ground substrate 11, and performing a pattern search on the image.

FIG. 8 illustrates the overall structure of one example of a repair device used for detecting and repairing banks having defect portions.

The repair device illustrated in FIG. 8 (repair device 200) includes a base 201, and a table 202 and a head portion 210 over the base 201. The table 202 is a table on which the ground substrate 11 is placed. The head portion 210 has attached thereto an image capture element 211 and a dispenser 212. The table 202 is moveable along the Y direction in accordance with an instruction from a controller 230. The head portion 210 is likewise moveable along the X direction and the Z direction in accordance with an instruction from the controller 230.

Accordingly, in accordance with an instruction from the controller 230, the image capture element 211 and the dispenser 212, which are attached to the head portion 210, are capable of moving above the ground substrate and in the X direction, the Y direction, and the Z direction relative to the ground substrate 11, which is placed on the table 202.

Using the repair device 200, image data of a top surface of the ground substrate 11 is captured as the image capture element 211 is moved along the top surface of the ground substrate 11. The image data is stored in a storage unit 231 of the controller 230.

The controller 230 compares portions of banks 14*a* in the image data one after another, and is capable of detecting differences between the banks 14*a* as defect portions 3. Then, upon detecting a defect portion 3, the controller 230 stores coordinate data (a coordinate value in the X direction and a coordinate value in the Y direction) of the defect portion 3 so detected in the storage unit 231.

During this detection process, there is a possibility of defect portions 3 being detected in several of the banks 14*a* formed over the ground substrate 11, and also there is a possibility of no defect portion 3 being detected in any of the banks 14*a*.

When any bank 14*a* having a defect portion 3 is detected, the bank 14*a* is repaired.

[Method for Repairing Bank Having Defect Portion]

Next, a bank 14a having a defect portion 3 is repaired by causing the dispenser 21 to apply a repair material for forming dams over the ground substrate 11 mounted on the table 202 so as to surround the defect portion 3 and thereby forming dams 5.

Here, as illustrated in FIG. 6B, a pair of dams 5 is formed in each of adjacent groove spaces 20 between which the bank 14a having the defect portion 3 is located. The pair of dams 5 in each groove space 20 is such that one of the dams 5 extends between point $A_1$ of the bank 14a having the defect portion 3 and an adjacent bank 14a, and the other of the dams 5 extends between point $A_2$ of the bank having the defect portion 3 and the adjacent bank 14a. Points $A_1$ and $A_2$ are points of the bank 14a having the defect portion 3 between which the defect portion 3 is located in the Y direction. Accordingly, a total of four dams 5 are formed in the groove spaces 20 around the defect portion 3, and the dams partition the groove spaces 20 in the X direction and form a lattice structure.

The dispenser 212 of the repair device 200 is a needle dispenser. The dispenser 212 has a tank 214 attached at a top portion thereof. The tank 214 stores the repair material. The dispenser 212 is capable of applying the repair material in microliter units by moving a needle 213 up and down through the tank 214 to cause the repair material to adhere to the needle 213.

The needle 213 of the dispenser 212 is driven in accordance with a control signal from the controller 230.

The repair material may be any resin composition that hardens when exposed to light, heat, or the like.

The resin may be, for example, a curable resin containing an ethylene double bond, such as a (meth) acryloyl group, an aryl group, a vinyl group, or a vinyloxy group.

Also, a cross-linking agent, such as an epoxy compound or a polyisocyanate compound, that forms a cross-link with the resin may also be contained in the repair material as an additive.

The resin in the repair material may be a fluoride polymer, in which fluoride atoms are included in the resin structure. Using resin including fluoride atoms as the resin material provides ink repellency to dams 5 formed by using the repair material. Alternatively, various ink repelling agents may be added to the resin. In any case, the content of the ink repelling agent should be between 0.01 wt % and 10 wt %. Adding an ink repelling agent by an amount within this range ensures that the resin compound is stable during storage, and also provides dams 5 formed by using the repair material with high ink repellency.

Also, the same material as the bank material used for forming the banks 14a may be used as the repair material. Here, it should be noted that bank material typically includes an acid component that is soluble to an alkaline developing fluid. However, it is preferable that the repair material for forming the dams does not include such an acid component. This is because developing is not performed in the forming of dams 5, and accordingly acid component remaining in the dams 5 would provide the dams 5 with low resistance to solvents.

Further, the resin composition in the repair material may contain a solvent and a photopolymerization initiator as additives, when necessary.

The solvent is a solvent dissolving the resin and the photopolymerization initiator. At the same time, preferably, one or more types of solvents not prone to drying during the repairing (e.g., solvents having a boiling point approximately within the range between 150° C. and 250° C.) are used, and more preferably, two or more types of such solvents are used.

The solvent may be a solvent dissolving the resin and having a boiling point approximately within the range between 150° C. and 250° C.

The photopolymerzation initiator may be any type of photopolymerization initiator available on the market.

Further, upon the application of the repair material, the repair material is adjusted so that the content of solid components in the repair material is between, for example, 20 wt % and 90 wt %, and the repair material has a viscosity between, for example, 10 cP/25° C. and 50 cP/25° C. (where cP is the unit centipoise).

Further, the amount of the photopolymerization initiator added is adjusted in accordance with the amount of light exposure in the light exposure process performed before the firing process. For example, the amount of the photopolymerzation initiator added is to be adjusted such that the content of the photopolymerzation initiator with respect to the total solid component of the repair material is between 0.1 wt % and 50 wt %, and more preferably, between 5 wt % and 30 wt %.

A dam 5a in any groove space 20 is formed by using the dispenser 212 and applying the repair material with respect to a plurality of predetermined positions along a line on which a dam 5 is to be formed.

The controller 230 of the repair device 200 stores image data of the banks 14a and the coordinate data of a defect portion 3 as described above. Thus, in accordance with these data, the controller 230 is capable of accurately applying the repair material with respect to positions set around the defect portion 3.

FIG. 9A is a diagram indicating application positions set in the image around the defect portion 3.

As illustrated in FIG. 9A, in each of the adjacent groove spaces between which a bank 14a having the defect portion 3 is located, application points $P_1$, $P_2$, $P_3$, $P_4$ are set along each of a dam forming line extending in the X direction through point $A_1$ and a dam forming line extending in the X direction through point $A_1$. Point $A_1$ is set at a distance $a_1$ in the Y direction from a reference point O, which corresponds to a center portion of the defect portion 3, and point $A_2$ is set at a distance $a_2$ in the direction opposite the Y direction from the reference point O.

Here the distance $a_1$ and the distance $a_2$ may be the same or may be different. In either case, the distance $a_1$ and the distance $a_2$ are to be set appropriately so that the entire defect portion 3 is between point $A_1$ and point $A_2$. However, setting overly great values to the distance $a_1$ and the distance $a_2$ is not preferable.

FIG. 9B is a schematic cross-sectional view illustrating a cross-section of the ground substrate 11 taken along the dam formation line passing through point $A_1$.

The repair device 200 forms a dam 5a by applying the repair material with respect to the application points $P_1$, $P_2$, $P_3$, $P_4$, which have been set as described above, one after another by using the needle 213.

FIG. 10A through FIG. 10G are diagrams illustrating how a dam 5a is formed by applying the repair material with respect to the application points $P_1$, $P_2$, and so on one after another.

First, as illustrated in FIG. 10A and FIG. 10B, with the needle 213 and the tank 214 positioned at application point $P_1$, the needle 213 is moved downward so that the repair material adheres to the needle 213. Then, the needle 213 is moved toward application point $P_1$ to apply the repair material with respect to application point $P_1$.

The repair material has fluidity until application. However, after application, the repair material maintains a mound shape. Thus, as illustrated in FIG. 10C, a mound of the repair material is formed at application point $P_1$.

Subsequently, as illustrated in FIG. 10D, the needle 213 is withdrawn upwards into the tank 241, and the needle 213 and the tank 214 are moved to application point $P_2$. Then, the needle 213 is moved downward so that the repair material adheres to the needle 213, and the needle 213 is moved toward application point $P_2$ to apply the repair material with respect to application point $P_2$.

Thus, the mound of the repair material that is formed at application point $P_2$ connects to the mound of the repair material having been formed at application point $P_1$, as illustrated in FIG. 10E.

Then, as illustrated in FIG. 10F, the needle 213 is withdrawn upwards and moved to application point $P_3$. Then, in a similar manner as described above, a mound of the repair material is formed at application point $P_3$, which connects to the mound of the repair material having been formed at application point $P_2$.

As such, mounds of the repair material are formed continuously on a line extending from point $A_1$ on the bank 14a having the defect portion 3 to an adjacent bank 14a. Then, the mounds of the repair material so applied are dried and exposed to light as needed, thereby forming a dam 5a.

Note that the subsequent simultaneous firing process causes the repair material so applied to harden. Thus, a dam 5 having high physical stability is formed.

A pair of dams 5 is formed in each of groove spaces 20 between which a bank 14 having a defect portion 3 is located, as illustrated in FIG. 6B. The dams 5 in each groove space 20 partition the groove space 20 into a first space SA in the vicinity of the defect portion 3, and two second spaces SB outside the vicinity of the defect portion 3. Further, the defect portion 3 is surrounded by two first spaces SA.

The subsequent light-emitting layer formation process of step S9, which is for forming organic light-emitting layers 15 in the respective groove spaces 20, is performed with any bank 14 having a defect portion 3 having been repaired in such a manner. Due to this, the ink applied fills both the first space SA and the second spaces SB, whereby organic light-emitting layers 15 are formed in the first space SA and the second spaces SB. Accordingly, in the panel after the forming of light-emitting layers, dams 5 partition an organic light-emitting layer 15 in the first space SA from organic light-emitting layers 15 in the second spaces SB.

[Effects of Bank Repair Method]

FIG. 11A is a plan view diagram illustrating a state where, in the panel pertaining to the present Embodiment, dams 5 have been formed around a bank 14 having a defect portion 3, and an ink layer 15a (R) has been formed in one of adjacent groove spaces 20 between which the bank 14 having the defect portion 3 is located through the application of red ink and an ink layer 15a (G) has been formed in the other one of the adjacent groove spaces 20 through the application of green ink. Meanwhile, FIG. 11B is a plan view diagram illustrating a state where, in a comparative example in which dams 5 are not formed, an ink layer 15a (R) and an ink layer 15a (G) have been formed in adjacent groove spaces 20 between which a bank 14 having a defect portion 3 is located.

As illustrated in FIG. 11B, without the dams 5 formed around the bank 14 having the defect portion 3, the red ink and the green ink mix via the defect portion 3 and produce color mixture regions that spread in the ink layers 15a. The color mixture regions may extend far along the Y direction, and the length thereof may extend to around 1 cm.

Once the manufacturing of the display panel 100 is completed, these color mixture regions emit light having a color different from the originally intended color. Specifically, as described above, a color mixture region formed by mixing of red ink and green ink emits red light. Accordingly, when such a color mixture region is formed in a region intended to emit green light, the color mixture region emits red light, and causes light-emission color failure.

In view of this, in the present Embodiment, as described above, pairs of dams 5 are disposed around a bank 14 having a defect portion 3. Each pair of dams 5 partitions a groove space 20 into a first space SA that is the space between the two dams 5 and that is in the vicinity of the defect portion 3, and two second spaces SB that are located outside the two dams 5 and that are not in the vicinity of the defect portion 3. Due to this, the color mixture region is confined within a specific area, as described in the following.

FIG. 12 is a cross-sectional view taken along line C-C in FIG. 11A, and shows a Y-direction cross section illustrating a state where an ink layer 15a (G) has been formed by applying ink with respect to a groove space 20 in which dams 5 have been formed.

Specifically, when ink for forming light-emitting layers is applied with respect to the groove spaces 20 between the banks 14, an ink layer 15a (G) is formed in the first space SA between the dams 5 and in each of the two second spaces SB outside the dams 5 as illustrated in FIG. 12.

Here, as illustrated in FIG. 11A, there are cases where the first space SA becomes a color mixture region due to red ink and green ink mixing via the defect portion 3. However, the ink layer 15a formed in the first space SA and the ink layers 15a formed in the second spaces SB, which are outside the pair of dams 5, do not mix with one another due to the dams 5 serving as partitions therebetween.

Accordingly, even if a color mixture region is formed in the first space SA, the color mixture region does not spread beyond the dams 5 into the second spaces SB.

As such, the present Embodiment achieves the effect of confining the color mixture region produced due to the defect portion 3 within the first space SA, which is a relatively small space in the vicinity of the defect portion 3. Thus, the present Embodiment achieves the effect of preventing the spread of the color mixture region, and reduces light-emission color failure of the display panel 100.

In addition, the effect achieved by the repair of forming dams 5 is particularly great when applied to the line bank structure. This is since, with the line bank structure, the risk is high of light-emission color failure occurring when mixture of inks of different colors occurs, due to the color mixture region readily spreading. However, as described later in the modifications, the forming of dams 5 achieves a positive effect not only with the line bank structure but also with the pixel bank structure.

Meanwhile, another possible measure for preventing the mixture of inks of different colors due to the presence of a defect portion 3 is repairing the defect portion 3 by covering the defect portion 3 itself with a repair material similar to that described above. However, in order to reliably prevent the mixture of inks of different colors by using such a measure, it is necessary for instance, to cover the entire foreign particle making up the defect portion 3 with the repair material or to repair the collapsed portion making up the defect portions 3 with the repair material. In particular, repairing the defect portion 3 in such a manner by using a dispenser or the like requires performing application while precisely controlling the position of the application needle of the dispenser. Also, when the defect portion 3 is a foreign particle, there are many cases where the defect portion 3 cannot be repaired properly due to the foreign particle repelling the repair material, and thus the application of the repair material is technically difficult.

In contrast, with a repair method such as that described in the present Embodiment, in which dams 5 are formed around a bank 14 having a defect portion 3, the repair material is not directly applied onto the defect portion 3 but is rather applied so as to surround the defect portion 3. Thus, with such a repair method, the repair material can be applied relatively easily without the risk of the repair material being repelled by the foreign particle.

Further, if a light-emitting layer is not formed at a certain region of a groove space 20, current leakage of a considerable level would occur between the hole injection layer 13 and the common electrode 17 at the region after the manufacture of the display panel 100 is completed, and thus the region may become a defect of the display panel 100. However, such current leakage does not occur with the present Embodiment.

Specifically, in the present Embodiment, dams 5 formed in a groove space 20 are spaced away from the defect portion 3 by distances $a_1$ and $a_2$. Due to this, as illustrated in FIG. 11A, an ink layer 15a is also formed in the region between the dams 5. Even though this ink layer 15a is a color mixture region, no short circuiting or current leakage between the hole injection layer 13 and the common electrode 17 occurs in the display panel 100 at the region between the dams 5.

[Distance Between Defect Portion 3 and Dams 5, and Height and Width of Dams 5]

The Y-direction distance between a defect portion 3 and dams 5 is dependent on the distance between point $A_1$ and point $A_2$ (i.e., distance $(a_1+a_2)$).

The distance $(a_1+a_2)$ between point $A_1$ and point $A_2$ needs to be great enough so that the defect portion 3 is located between the points $A_1$ and $A_2$.

Also, when the space between a defect portion 3 and dams 5 is excessively small, a light-emitting layer may not be formed in the region between the dams 5 due to a reason such as ink droplets arriving in the region being repelled. Accordingly, it is preferable to set the distance between point $A_1$ and point $A_2$ to a distance sufficient to secure that ink is applied with respect to the region between the dams 5.

Meanwhile, in order to achieve the effect of preventing light-emission color failure, it is preferable to set the distance between point $A_1$ and point $A_2$ as small as possible. In this sense, it is preferable to set the distance between point $A_1$ and point $A_5$ to a length no longer than the Y-direction length of a sub-pixel.

The following is a consideration regarding the height of dams 5 (i.e., the height of dams 5 from bottom surfaces of groove spaces 20).

In the process in step S9 of forming the organic light-emitting layers 15, ink is applied with respect to a first space SA and second spaces SB. The first space SA is partitioned from the second spaces SB by dams 5. Thus, an ink layer 15a is formed, in the first space SA and in each of the second spaces SB.

As illustrated in FIG. 12, the ink layer 15a in the first space SA is partitioned from the ink layers 15a in the second spaces SB by dams 5.

Here, when the height of the dams 5 is overly low, the function of the dams 5 of partitioning such ink layers 15a is impaired. That is, if the dams 5 were to have overly low height, the ink layer 15a in the first space SA would mix with the ink layers 15a in the second spaces SB, and the color mixture region would spread to the second spaces SB. For instance, in the example illustrated in FIG. 12, if the dams 5 were to have overly low height, the green ink layer 15a in the first space SA, having red ink mixed therein, would mix with the green ink layers 15a (G) in the second spaces SB, and the color mixture region containing a mixture of red ink and green ink would spread to the second spaces SB.

Accordingly, the height of the dams 5 is preferably set to a height allowing the dams 5 to sufficiently accomplish the function of partitioning the ink layer 15a in the first space SA from the ink layers 15a in the second spaces SB.

Meanwhile, if the dams 5 were to have overly high height, the risk would increase of tier cutting occurring in layers to be formed above the dams 5, e.g., the electron transport layer 16 and the common electrode 17.

Based on this consideration, it is preferable to set the height of the dams 5 to be no less than 50% and no more than 200% of the height of the banks 14. It is more preferable to set the height of the dams 5 to be similar to the height of the banks 14.

Meanwhile, it is preferable that the width of the dams 5, or more specifically, the width of the dams 5 in a direction perpendicular to the dam forming lines (the Y direction), be set to no more than 50 μm. This is since dams 5 with excessively great width pose a risk of the dams 5 themselves being noticeable when the display panel 100 is viewed.

Embodiment 2

Embodiment 2 is similar to Embodiment 1 in terms of the structure and manufacturing method of the display panel 100.

Also, Embodiment 2 is similar to Embodiment 1 in that dams 5a are formed in each of adjacent groove spaces 20 between which a bank 14a having a defect portion 3 is located. However, Embodiment 2 differs from Embodiment 1 in terms of the shape of the dams 5a formed.

FIG. 13A is a perspective view illustrating the shape of the dams 5a pertaining to Embodiment 2. FIG. 13B is a plan view illustrating a state where ink layers have been formed after the dams 5 have been formed in groove spaces.

In the present Embodiment, a pair of dams 5a is formed. Each of the dams 5a has the shape illustrated in FIG. 13B. Specifically, in plan view of the X-Y plane, each dam 5a extends between two points (point $A_1$ and point $A_2$) between which the defect portion 3 is located in the Y direction, while detouring around the defect portion 3. Also, each dam 5a is in contact with a bank 14 adjacent to the bank 14a having the detect portion 3 at point $A_3$ located at some point along the path between point $A_1$ and point $A_2$.

The dams 5a in Embodiment 2 are formed by using a method similar to the method described in Embodiment 1 with reference to FIG. 10A through FIG. 10F. Specifically, each dam 5a is formed by applying the repair material with respect to a plurality of application points set along a dam forming line that extends between point $A_1$ and point $A_2$ via point $A_3$, one after another.

By disposing the dams 5a in adjacent groove spaces 20 between which the bank 14 having the defect portion 3 is located, each of the groove spaces 20 is partitioned by a dam 5a into a first space SA in the vicinity of the defect portion 3, and two second spaces SB outside the vicinity of the defect portion 3, as illustrated in FIG. 13A. Further, the defect portion 3 is surrounded by two first spaces SA.

Accordingly, the dams 5a pertaining to Embodiment 2 achieve the effect of confining the color mixture region, similar to the dams 5a pertaining to Embodiment 1.

Specifically, as illustrated in FIG. 13B, even if a color mixture region is formed in a groove space 20 between banks 14 by red ink and green ink mixing via a defect portion 3 when inks for forming light-emitting layers are applied, the color mixture region does not spread beyond the dam 5 into the second spaces SB. As such, the color mixture region produced by the defect portion 3 is confined within the first space SA, which is a relatively small space in the vicinity of the defect portion 3. Thus, the dams 5 pertaining to the Embodiment 2 reduce the risk light-emission color failure occurring in the display panel 100.

Also, the dams 5a are formed by applying the repair material so as to surround the defect portion 3. As such, Embodiment 2 is similar to Embodiment 1 in that the defect portion 3 can be repaired easily, and further, in that no current leakage occurs at a first space surrounded by a dam 5, after the display panel 100 has been manufactured.

Meanwhile, the dams 5 in Embodiment 2 form first areas SA with smaller surface areas than the first areas SA formed by the dams 5 in Embodiment 1. Thus, Embodiment 2 prevents light-emission color failure of the display panel 100 to a further extent.

Embodiment 3

Embodiment 3 is similar to Embodiment 1 in terms of the structure and manufacturing method of the display panel 100.

Also, Embodiment 3 is similar to Embodiment 1 in that dams 5a are formed in adjacent groove spaces 20 between which a bank 14a having a defect portion 3 is located, when the bank 14a having the defect portion 3 is repaired. However, Embodiment 3 differs from Embodiment 1 in terms of the shape of the dams 5a formed.

FIG. 14A is a perspective view illustrating the shape of the dams 5a pertaining to Embodiment 3. FIG. 14B is a plan view illustrating a state where ink layers have been formed after the dams 5 have been formed in groove spaces 20.

Each dam 5a pertaining to the present Embodiment has the shape illustrated in FIG. 14A. Similar to Embodiment 2, in plan view of the X-Y plane, each dam 5a extends between two points (point $A_1$ and point $A_2$) between which the defect portion 3 is located in the Y direction, while detouring around the defect portion 3. However, Embodiment 3 differs from Embodiment 2 in that each dam 5a does not come in contact with a bank 14 adjacent to the bank 14a having the defect portion 3. In other words, the dams 5a pertaining to the present Embodiment are such that a maximum X-direction distance b between each dam 5a and a center of the defect portion 3 is set so as to be smaller than the width (X-direction width) of a groove space 20.

The dams 5a in Embodiment 3 can also be formed by using a method similar to the method described in Embodiment 1 with reference to FIG. 11A through FIG. 11F. Specifically, each dam 5a can be formed by applying the repair material with respect to a plurality of application points set along a dam forming line that extends between point $A_1$ and point $A_2$, one after another.

By disposing the dams 5a in adjacent groove spaces 20 between which the bank 14 having the defect portion 3 is located, each of the groove spaces 20 is partitioned by a dam 5a into a first space SA in the vicinity of the defect portion 3 and a second space SB outside the vicinity of the defect portion 3, as illustrated in FIG. 14A. Accordingly, the dams 5a pertaining to Embodiment 3 achieve the effect of confining the color mixture region, similar to the dams 5a pertaining to Embodiment 1.

Specifically, as illustrated in FIG. 14B, even if a color mixture region is formed in a groove space 20 between banks 14 by red ink and green ink mixing via the defect portion 3 when inks for forming light-emitting layers are applied, the color mixture region does not spread beyond the dam 5 into the second space SB.

Also, the dams 5a are formed by applying the repair material so as to surround the defect portion 3. As such, Embodiment 2 is similar to Embodiment 1 in that the defect portion 3 can be repaired easily, and further, in that no current leakage occurs at the spaces surrounded by the dams 5, after the display panel 100 has been manufactured.

Meanwhile, the dams 5 in Embodiment 3 form first areas SA with smaller surface areas than the first areas SA formed by the dams 5 in Embodiments 1 and 2. Thus, Embodiment 3 prevents light-emission color failure of the display panel 100 to a further extent.

Embodiment 4

Embodiment 4 is similar to Embodiment 1 in terms of the structure and manufacturing method of the display panel 100.

FIG. 15A is a perspective view illustrating the shape of the dams 5a pertaining to Embodiment 4. FIG. 15B is a cross-sectional view illustrating a state where fluorescent ink is being applied after the dams 5 have been formed in groove spaces.

Embodiment 4 is similar to Embodiment 1 in terms of the shapes of the dams 5a formed in adjacent groove spaces 20 between which a bank 14a having a defect portion 3 is located in the process of repairing the bank 14a having the defect portion 3, as illustrated in FIG. 15A. However, the present Embodiment differs from Embodiment 1 in that protruding portions 6a protruding upwards from top portions of banks 14a are formed, where banks 14a are in contact with end portions of dams 5a.

The protruding portions 6a can be formed by applying the repair material used for forming the dams 5a with respect to the top portions of banks 14a using the above-described needle dispenser, and then drying the repair material so applied.

After being formed in such a manner, the protruding portions 6a are hardened, alongside the banks 14a and the dams 5a, in the simultaneous firing process (step S8 of FIG. 4), whereby they become stable protruding portions 6.

A protruding portion 6 formed in such a manner achieves the effect of preventing ink applied with respect to one groove space 20 in the process in step S9 of forming the organic light-emitting layers 15 from spreading beyond a bank 14 into an adjacent groove space 20.

Specifically, in the application of ink, ink droplets arriving directly on a dam 5 are repelled at the top portion of the dam 5, and flow along the top portion of the dam 5 in the X direction, as indicated by the arrows in FIG. 15B. Here, without the protruding portions 6, the ink droplets flowing in the X direction would head towards adjacent groove spaces 20 over banks 14. Meanwhile, with the protruding portions 6 present at the end portions of the dam 5, the protruding portions 6 block the ink droplets heading towards the adjacent groove spaces 20, whereby ink is prevented from spreading into the adjacent groove spaces 20.

Modifications

1. In Embodiments 1 to 4 and in the panels depicted in FIG. 6B, FIG. 11A, FIG. 13A, FIG. 13B, FIG. 14A, and FIG.

14B, dams 5 formed in groove spaces 20 between which a bank 14 having a defect portion 3 is located have line symmetry. However, dams 5 formed in groove spaces 20 between which a defect portion 3 is located need not have symmetry.

For example, FIG. 6B and FIG. 11A pertaining to Embodiment 1 each illustrate two dams 5 extending in the X direction along one same line passing through point $A_1$ and two other dams 5 extending in the X direction along one same line passing through point $A_2$. However, each dam may extend in the X direction along a different line.

Also, FIG. 13A and FIG. 13B pertaining to Embodiment 2 and FIG. 14A and FIG. 14B pertaining to Embodiment 3 each illustrate two dams 5 both extending between point $A_1$ and point $A_2$. However, the two dams 5 may have different start points and different end points.

In addition, FIG. 14B pertaining to Embodiment 3 illustrates two dams 5 with the same maximum X-direction distance b from the center of a defect portion 3. However, the maximum distance b may differ between the two dams 5.

2. Embodiments 1 to 4 provide description of repair performed with respect to a defect portion in the line bank structure. However, the defect portion repair can be similarly applied to the pixel bank structure.

Each of FIG. 16A through FIG. 16D illustrates an example of repairing a defect portion in a display panel having the pixel bank structure.

Each of FIG. 16A through FIG. 16D illustrates a pixel bank structure composed of a plurality of banks 14 (first banks) elongated and extending in the Y direction and a plurality of banks 24 (second banks) elongated and extending in the X direction. With this pixel bank structure, organic EL elements 10 are disposed in rectangular regions defined by the banks 14 and the banks 24.

In each example, at least one dam 5 is formed in each of adjacent concave spaces 20 between which a bank that extends in the Y direction and has a defect portion 3 is located. A dam 5 in a concave space 20 partitions the concave space 20 into a space in the vicinity of the defect portion 3 and a space outside the vicinity of the defect portion 3.

Figure 16A:
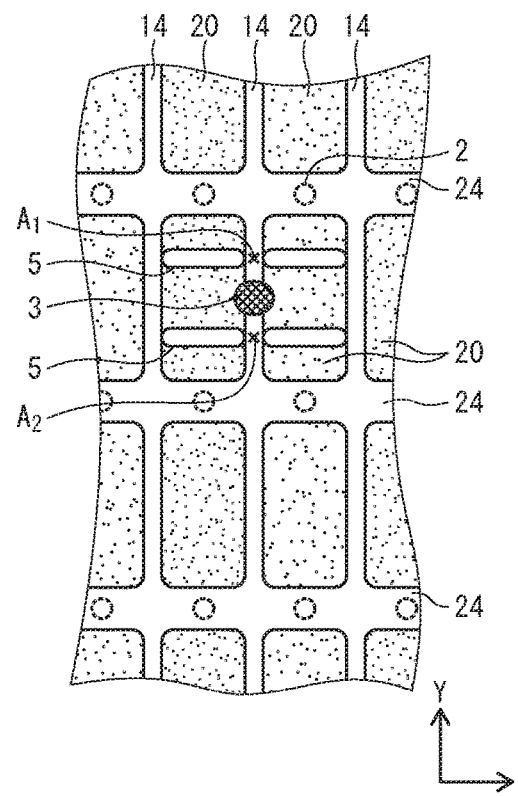

In FIG. 16A, a pair of dams 5 is formed in each of concave spaces 20 between which the bank 14 having the defect portion 3 is located. The two dams 5 extends between different ones of points $A_1$ and $A_2$ and a bank 14 opposite the bank 14 having the defect portion 3. This is similar to Embodiment 1.

In this example, even if a color mixture region is formed due to the presence of the defect portion 3 when ink application is performed, the color mixture region is confined within the space between the pair of dams 5. As such, this modification also prevents light-emission color failure.

Figure 16B:
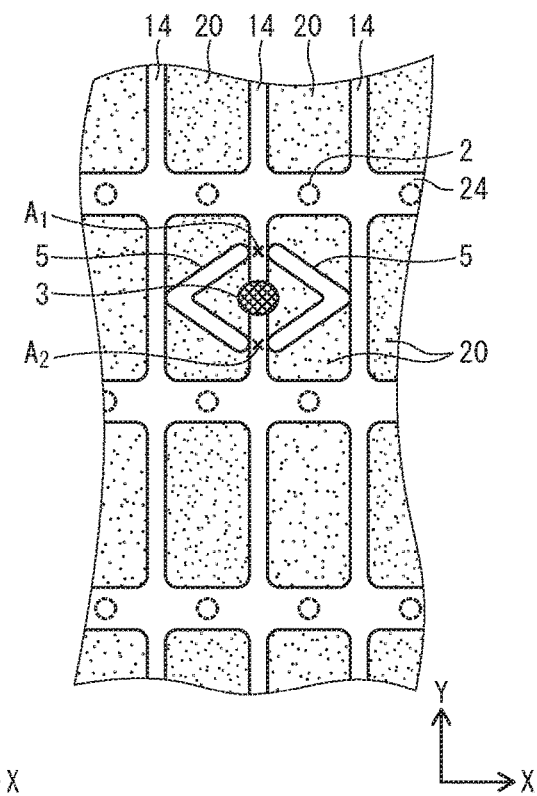

In FIG. 16B, a pair of dams 5 is formed, and each dam 5 is formed in a different one of concave spaces 20 between which the bank having the defect portion 3 is located. Each dam 5 extends between points $A_1$ and $A_2$, detouring around the defect portion 3. This is similar to Embodiment 2.

In this example as well, even if a color mixture is formed due to the presence of the defect portion 3 when ink application is performed, the color mixture region is confined within the space surrounded by the dam 5. As such, this modification also prevents light-emission color failure.

While not depicted in any of the drawings, the dams 5 of Embodiment 3 may also be applied with respect to the pixel bank structure. This modification also prevents light-emission color failure.

Figure 16C:
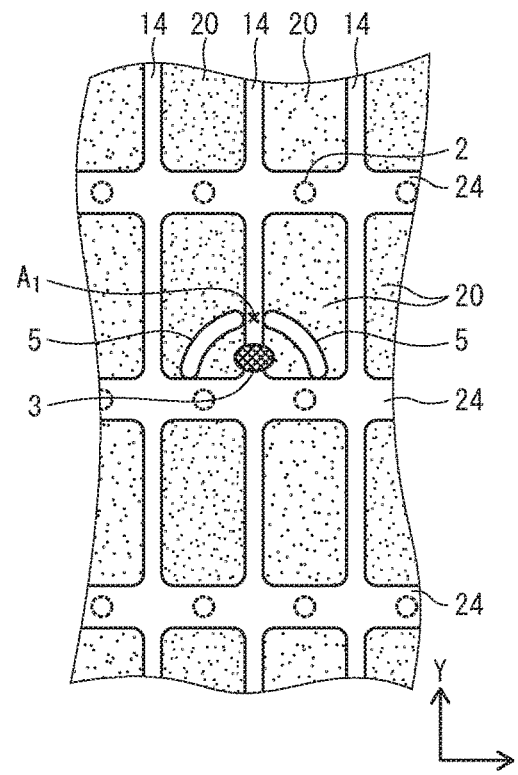

In FIG. 16C, a bank 14 has a defect portion 3 at a position relatively close to a bank 24. Further, a pair of dams 5 is formed, and each dam 5 is formed in a different one of concave spaces 20 between which the bank 14 having the defect portion 3 is located. The dam 5 extends between point $A_1$ and the bank 24, detouring around the defect portion 3.

In this example as well, even if a color mixture region is formed due to the presence of the defect portion 3 when ink application is performed, the color mixture region is confined within the space surrounded by the two dams 5 and the bank 24. As such, this modification also prevents light-emission color failure.

Figure 16D:
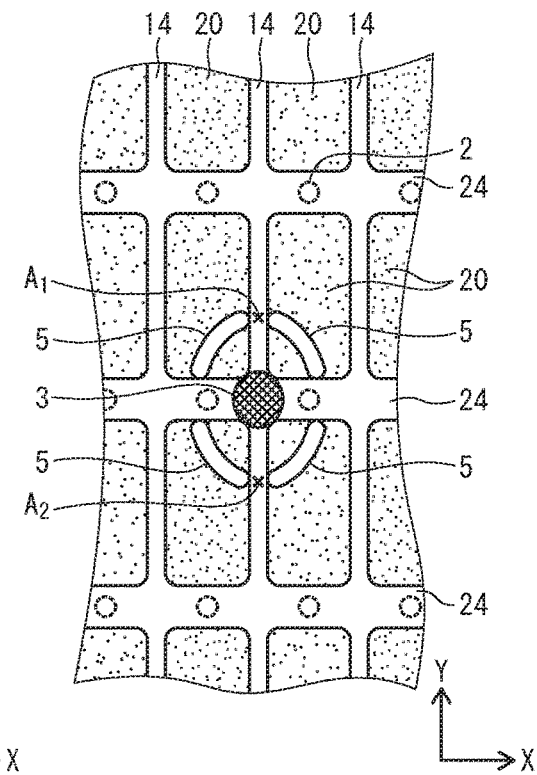

In FIG. 16D, a defect portion 3 exists where a bank 14 and a bank 24 intersect, and the defect portion 3 affects four concave spaces 20.

Further, a dam 5 is formed in each of these four concave spaces 20.

Specifically, among the four dams 5 that are formed, two dams 5 each extend between point $A_1$ and the bank 24 while detouring around the defect portion 3, and two remaining dams 5 each extend between point $A_2$ and the bank 24 while detouring around the defect portion 3.

In this case, due to the presence of the defect portion 3, color mixture may occur between the four concave spaces 20 when ink application is performed. However, even if color mixture regions are actually formed, the color mixture regions are confined within the spaces surrounded by the four dams 5. As such, this modification also prevents light-emission color failure.

3. The Embodiments are described while taking a top emission organic EL panel as an example. However, the Embodiments are also applicable to a bottom emission organic EL panel.

INDUSTRIAL APPLICABILITY

The present invention is applicable to an organic EL display device used, for example, in various display devices, television devices, portable electronic device displays, and so one used in private homes, public facilities, and for commercial use. The present invention is also applicable to a manufacturing method of such an organic EL display device, and a bank repair method employed in the manufacturing method.

LIST OF REFERENCE SIGNS

1 Organic EL display device
2 Contact hole
3 Defect portion
5 Dam
5a Unfired dam
6 Protruding portion
6a Unfired protruding portion
10 Organic EL element
11a Substrate body
11 Ground substrate
11b TFT layer
11c Interlayer insulation layer
12 Pixel electrode
13 Hole injection layer
14 Bank
14a Unfired bank
15a Ink layer
15 Organic light-emitting layer
16 Electron transport layer
17 Common electrode 18 Sealing layer
20 Concave space (Groove space)
21 Dispenser
24 Bank (Second bank)
100 Display panel
200 Repair device

The invention claimed is:

1. A bank repair method for repairing a defect portion of a bank in a process of manufacturing an organic electroluminescence (EL) display device including a substrate, banks formed over the substrate, and light-emitting layers formed in concave spaces defined by the banks, the bank repair method comprising:
    examining whether or not a bank having a defect portion is present; and
    when a bank having a defect portion is present, forming a dam in each of adjacent concave spaces between which the bank having the defect portion is located, a dam formed in a concave space partitioning the concave space into a first space in a vicinity of the defect portion and a second space outside the vicinity of the defect portion.

2. The bank repair method according to claim 1, wherein the banks all extend in one direction along a surface of the substrate and each have a rectangular shape in plan view, and appear as a plurality of parallel lines in plan view, and
    the dam in each of the adjacent concave spaces is a pair of dams, the dams each extending from a different one of two points of the bank having the defect portion to an adjacent bank, the defect portion being located between the two points in the one direction.

3. The bank repair method according to claim 2 further comprising
    forming protruding portions protruding from upper portions of bank portions in contact with the dams, the bank portions comprising portions of the bank having the defect portion that are in contact with end portions of the dams and portions of the adjacent bank that are in contact with end portions of the dams.

4. The bank repair method according to claim 1, wherein the banks all extend in one direction along a surface of the substrate and each have a rectangular shape in plan view, and appear as a plurality of parallel lines in plan view, and
    the dam in each of the adjacent concave spaces is a single dam extending between two points of the bank having the defect portion while detouring around the defect portion, the defect portion being located between the two points in the one direction.

5. The bank repair method according to claim 4, wherein the single dam is in contact with a bank adjacent to the bank having the defect portion at some point along a path between the two points.

6. The bank repair method according to claim 4, wherein the single dam is not in contact with a bank adjacent to the bank having the defect portion.

7. The bank repair method according to claim 1, wherein the defect portion is a portion of a bank where a foreign particle is present or a portion of a bank having collapsed.

8. An organic electroluminescence (EL) display device comprising:
    a substrate;
    banks formed over the substrate; and
    light-emitting layers disposed in concave spaces defined by the banks, wherein
    a dam is disposed in each of adjacent concave spaces between which a bank having a defect portion is located, a dam disposed in a concave space partitioning a light-emitting layer disposed in the concave space into a first light-emitting layer in a vicinity of the defect portion and a second light-emitting layer outside the vicinity of the defect portion.

9. The organic EL display device according to claim 8, wherein
    the banks all extend in one direction along a surface of the substrate and each have a rectangular shape in plan view, and appear as a plurality of parallel lines in plan view, and
    the dam in each of the adjacent concave spaces is a pair of dams, the dams each extending from a different one of two points of the bank having the defect portion to an adjacent bank, the defect portion being located between the two points in the one direction.

10. The organic EL display device according to claim 9 further comprising
    protruding portions protruding from upper portions of bank portions in contact with the dams, the bank portions comprising portions of the bank having the defect portion that are in contact with end portions of the dams and portions of the adjacent bank that are in contact with end portions of the dams.

11. The organic EL display device according to claim 8, wherein
    the banks all extend in one direction along a surface of the substrate and each have a rectangular shape in plan view, and appear as a plurality of parallel lines in plan view, and
    the dam in each of the adjacent concave spaces is a single dam extending between two points of the bank having the defect portion while detouring around the defect portion, the defect portion being located between the two points in the one direction.

12. The organic EL display device according to claim 11, wherein
    the single dam is in contact with a bank adjacent to the bank having the defect portion at some point along a path between the two points.

13. The organic EL display device according to claim 11, wherein
    the single dam is not in contact with a bank adjacent to the bank having the defect portion.

14. The organic EL display device according to claim 8, wherein
    the defect portion is a portion of a bank where a foreign particle is present or a portion of a bank having collapsed.

15. The organic EL display device according to claim 8, wherein
    the first light-emitting layer contains materials of adjacent second light-emitting layers between which the bank having the defect portion is located.

16. A method for manufacturing an organic EL display device by forming banks over a substrate and forming light-emitting layers in concave spaces defined by the banks, the method comprising:
    examining whether or not a bank having a defect portion is present;
    when a bank having a defect portion is present, forming a dam in each of adjacent concave spaces between which the defect portion is located, a dam formed in a concave space partitioning the concave space into a first space in a vicinity of the defect portion, and a second space outside the vicinity of the defect portion; and forming the light-emitting layers after forming the dam.

17. The method according to claim 16, wherein the dam is formed to be spaced away from the defect portion, and in the forming of the light-emitting layers, a portion of a light-emitting layer is formed in the space between the dam and the defect portion.

\* \* \* \* \*